(12) United States Patent
Wang et al.

(10) Patent No.: US 8,614,480 B2
(45) Date of Patent: Dec. 24, 2013

(54) POWER MOSFET WITH INTEGRATED GATE RESISTOR AND DIODE-CONNECTED MOSFET

(75) Inventors: Jun Wang, Bethlehem, PA (US); Shuming Xu, Schnecksville, PA (US); Jacek Korec, Sunrise, FL (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/540,862

(22) Filed: Jul. 3, 2012

(65) Prior Publication Data

US 2013/0009253 A1 Jan. 10, 2013

Related U.S. Application Data

(60) Provisional application No. 61/504,619, filed on Jul. 5, 2011.

(51) Int. Cl.
*H01L 29/66* (2006.01)

(52) U.S. Cl.
USPC ........... 257/329; 257/341; 257/500; 257/401; 257/502; 257/528; 257/516

(58) Field of Classification Search
USPC ......... 257/379, 341, 500, 401, 502, 578, 516, 257/528
See application file for complete search history.

(56) References Cited

U.S. PATENT DOCUMENTS

| 5,939,863 | A | * | 8/1999 | Miller | 320/136 |
| 2008/0121993 | A1 | * | 5/2008 | Hefner et al. | 257/341 |
| 2009/0127660 | A1 | * | 5/2009 | Kim et al. | 257/578 |

* cited by examiner

*Primary Examiner* — Kyoung Lee
*Assistant Examiner* — Ratisha Mehta
(74) *Attorney, Agent, or Firm* — Jacqueline J. Garner; Wade J. Brady, III; Frederick J. Telecky, Jr.

(57) ABSTRACT

A power MOSFET is formed in a semiconductor device with a parallel combination of a shunt resistor and a diode-connected MOSFET between a gate input node of the semiconductor device and a gate of the power MOSFET. A gate of the diode-connected MOSFET is connected to the gate of the power MOSFET. Source and drain nodes of the diode-connected MOSFET are connected to a source node of the power MOSFET through diodes. The drain node of the diode-connected MOSFET is connected to the gate input node of the semiconductor device. The source node of the diode-connected MOSFET is connected to the gate of the power MOSFET. The power MOSFET and the diode-connected MOSFET are integrated into the substrate of the semiconductor device so that the diode-connected MOSFET source and drain nodes are electrically isolated from the power MOSFET source node through a pn junction.

16 Claims, 23 Drawing Sheets

POWER MOSFET WITH INTEGRATED GATE RESISTOR AND DIODE-CONNECTED MOSFET

CROSS-REFERENCE TO RELATED APPLICATIONS

This application claims the benefit of priority under U.S.C. §119(e) of U.S. Provisional Application 61/504,619.

The following co-pending patent application is hereby incorporated by reference: U.S. patent application Ser. No. 13/540,813. With its mention in this section, this patent application is not admitted to be prior art with respect to the present invention

FIELD OF THE INVENTION

This invention relates to the field of semiconductor devices. More particularly, this invention relates to power transistors.

BACKGROUND OF THE INVENTION

Power transistors in switching circuits may experience ringing when the power transistor is turned on and off. Snubbing components which desirably limit the ringing may undesirably reduce efficiency of buck converters containing the power transistors.

SUMMARY OF THE INVENTION

A power metal oxide semiconductor field effect transistor (MOSFET) may be formed in a semiconductor device with a parallel combination of a shunt resistor and a diode-connected MOSFET between a gate input node of the semiconductor device and a gate of the power MOSFET. A gate of the diode-connected MOSFET is connected to the gate of the power MOSFET. Source and drain nodes of the diode-connected MOSFET are connected to a source node of the power MOSFET through diodes formed of pn junctions in the semiconductor substrate of the semiconductor device. The source node of the diode-connected MOSFET is connected to the gate input node of the semiconductor device. The drain node of the diode-connected MOSFET is connected to the gate of the power MOSFET. The power MOSFET and the diode-connected MOSFET are integrated into the substrate of the semiconductor device so that the diode-connected MOSFET source and drain nodes are electrically isolated from the power MOSFET source node through a pn junction.

DETAILED DESCRIPTION OF EXAMPLE EMBODIMENTS

Figure 1:
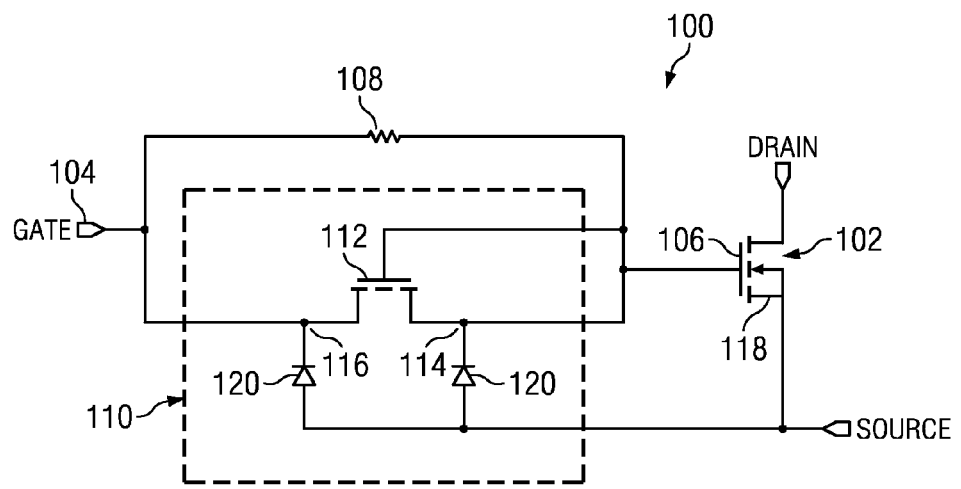
FIG. 1 and FIG. 2 are circuit diagrams of semiconductor devices having power MOSFETs of different polarities, with parallel shunt resistors and diode-connected MOSFETs.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A power metal oxide semiconductor field effect transistor (MOSFET) may be formed in a semiconductor device with a parallel combination of a shunt resistor and a diode-connected MOSFET between a gate input node of the semiconductor device and a gate of the power MOSFET. The power MOSFET and the diode-connected MOSFET are integrated into a substrate of the semiconductor device so that source and drain nodes of the diode-connected MOSFET are electrically isolated from a source node of the power MOSFET through diodes formed of pn junctions in the semiconductor substrate of the semiconductor device. A gate of the diode-connected MOSFET is connected to the gate of the power MOSFET. The diode-connected MOSFET source and drain nodes are connected to a source node of the power MOSFET through diodes. The source node of the diode-connected MOSFET is connected to the gate input node of the semiconductor device. The drain node of the diode-connected MOSFET is connected to the gate of the power MOSFET. When the power MOSFET is turned on by applying a turn-on signal to the gate input node of the semiconductor device, resistance of the diode-connected MOSFET is significantly higher than the parallel shunt resistor, so that the shunt resistor controls the turn-on time. When the power MOSFET is turned off by applying a turn-off signal to the gate input node of the semiconductor device, resistance of the diode-connected MOSFET is significantly lower than the parallel shunt resistor, so that the diode-connected MOSFET controls the turn-off time.

The semiconductor device may be a discrete power device which includes primarily the extended drain MOS transistor with shunt resistor and diode-connected MOSFET described herein. Alternatively, the semiconductor device may be an integrated which includes other circuits, such as sense circuits and/or control circuits, in addition to the power device described herein.

Figure 2:
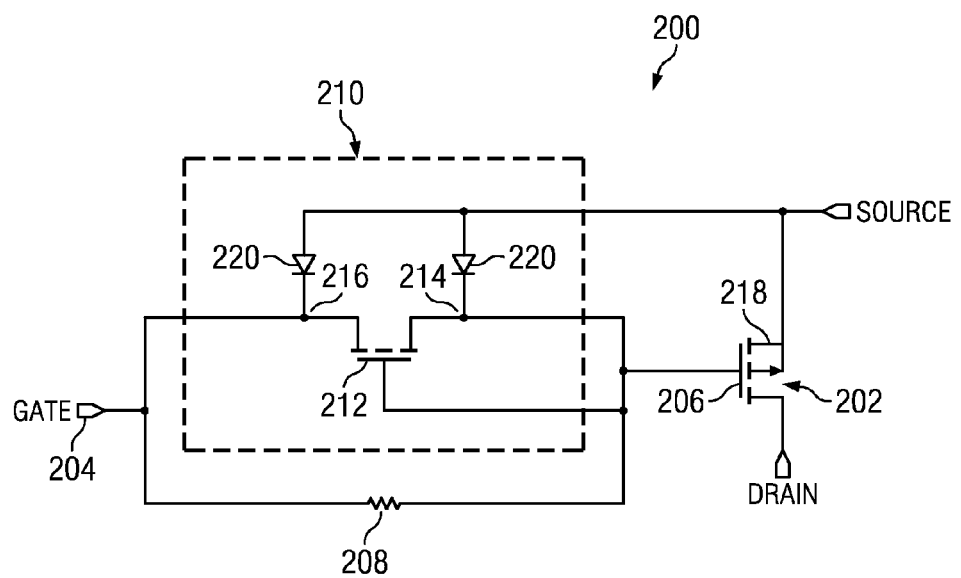

FIG. 1 and FIG. 2 are circuit diagrams of semiconductor devices having power MOSFETs of different polarities, with parallel shunt resistors and diode-connected MOSFETs. Referring to FIG. 1, the semiconductor device 100 includes an n-channel power MOSFET 102. A gate input node 104 of the semiconductor device 100 is connected to a gate 106 of the power MOSFET 102 through a parallel combination of a shunt resistor 108 and an n-channel diode-connected MOSFET 110. The power MOSFET 102 and the diode-connected MOSFET 110 are integrated into a substrate of the semiconductor device 100. A gate 112 of the diode-connected MOSFET 110 is connected to the power MOSFET gate 106. A drain node 114 and a source node 116 of the diode-connected MOSFET 110 are connected to a source node 118 of the power MOSFET 102 through diodes 120 formed of pn junctions in the semiconductor device substrate. The diode-connected MOSFET source 116 and drain 114 provide cathodes of the diodes 120. A p-type region in the semiconductor device substrate provides a common anode of the diodes 120. The diode-connected MOSFET source node 116 is connected to the semiconductor device gate input node 104. The diode-connected MOSFET drain node 114 is connected to the power MOSFET gate 106.

Referring to FIG. 2, the semiconductor device 200 includes a p-channel power MOSFET 202. A gate input node 204 of the semiconductor device 200 is connected to a gate 206 of the power MOSFET 202 through a parallel combination of a shunt resistor 208 and a p-channel diode-connected MOSFET 210. The power MOSFET 202 and the diode-connected MOSFET 210 are integrated into a substrate of the semiconductor device 200. A gate 212 of the diode-connected MOSFET 210 is connected to the power MOSFET gate 206. A drain node 214 and a source node 216 of the diode-connected MOSFET 210 are connected to a source node 218 of the power MOSFET 202 through diodes 220 formed of pn junctions in the semiconductor device substrate. The diode-connected MOSFET drain 214 and source 216 provide anodes of the diodes 220. An n-type region in the semiconductor device substrate provides a common cathode of the diodes 220. The diode-connected MOSFET source node 216 is connected to the semiconductor device gate input node 204. The diode-connected MOSFET drain node 214 is connected to the power MOSFET gate 206.

Figure 3:
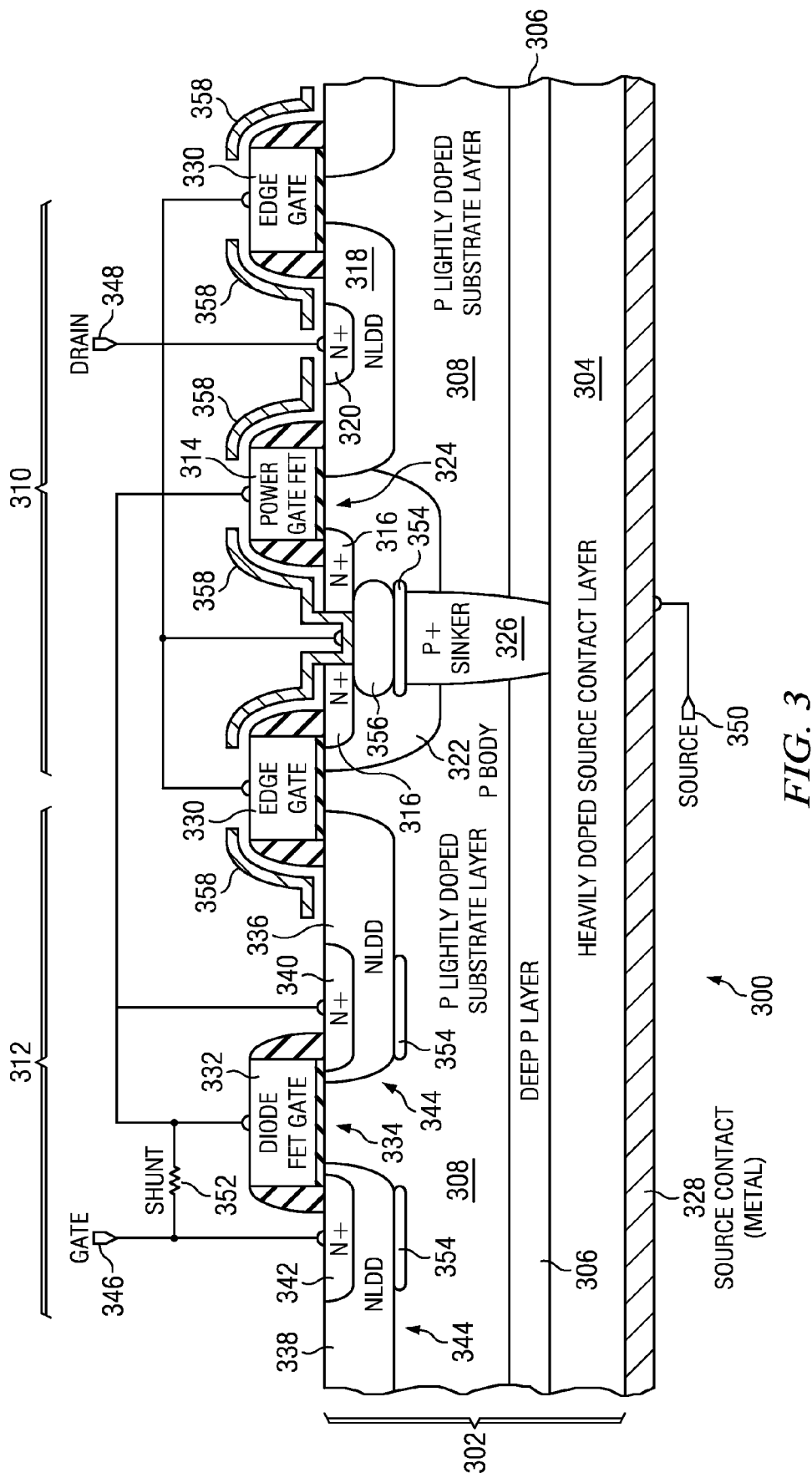
FIG. 3 is a cross section of a semiconductor device containing a vertical re-channel power MOSFET in a source-down configuration with a gate connected through a parallel shunt resistor and diode-connected MOSFET.

FIG. 3 is a cross section of a semiconductor device containing a vertical re-channel power MOSFET in a source-down configuration with a gate connected through a parallel shunt resistor and diode-connected MOSFET. It will be recognized that a p-channel version may be realized by appropriate changes of polarity of elements of the semiconductor device. The semiconductor device 300 is formed in and on a p-type semiconductor substrate 302 and includes a heavily doped p-type source contact layer 304 at a bottom surface of the substrate 302. A deep p-type layer 306 is disposed in the substrate, leaving 0.5 to 10 microns of lightly doped p-type substrate material 308 at a top surface of the substrate 302. The semiconductor device 300 includes an area defined for the power MOSFET 310 and an area defined for the diode-connected MOSFET 312 proximate to the power MOSFET 310.

The power MOSFET 310 has a gate structure 314 which includes a gate dielectric layer disposed on the top surface of the substrate 302 and a gate disposed on the gate dielectric layer. The gate may have an optional layer of metal silicide at a top surface of the gate. The power MOSFET 310 includes an n-type source region 316 in the substrate 302 adjacent to the power MOSFET gate structure 314. The power MOSFET 310 further includes an n-type extended lightly doped drain (NLDD) region 318 in the substrate 302 adjacent to the power MOSFET gate structure 314 opposite from the source region 316. The extended NLDD region 318 contains an n-type drain contact region 320 with a same average doping density as the source region 316. A p-type body region 322 of the power MOSFET 310 is disposed in the substrate 302 and extends to a channel region 324 under the power MOSFET gate structure 314 between the source region 316 and the extended NLDD region 318. An effective gate length of the power MOSFET 310, corresponding to a lateral distance between the source region 316 and the extended NLDD region 318, may be, for example, 0.3 to 1 micron. A p-type sinker 326 is disposed in the substrate 302 and provides a low electrical impedance connection between the body region 322 and the source contact layer 304. A metal source contact layer 328 is disposed on the bottom surface of the substrate 302.

An edge gate 330 may be disposed over the substrate 302 so as to overlap the extended NLDD region 318. The edge gate 330 may have a same structure as the power MOSFET gate structure 314.

The diode-connected MOSFET 312 has a gate structure 332 which has the same layer structure as the power MOSFET gate structure 314. The lightly doped substrate 308 may extend to a channel region 334 under the diode-connected MOSFET gate structure 332 to provide a body region for the diode-connected MOSFET 312. The diode-connected MOSFET 312 includes an n-type drain NLDD region 336 and an n-type source NLDD region 338 in the substrate 302 adjacent to, and on opposite sides of, the diode-connected MOSFET gate structure 332. The drain NLDD region 336 and the source NLDD region 338 have average doping densities substantially equal to the power MOSFET extended NLDD region 318. The drain NLDD region 336 contains an n-type drain contact region 340 and the source NLDD region 338 contains an n-type source contact region 342; both the drain contact region 340 and the source contact region 342 have an average doping density substantially equal to the power MOSFET source region 316 and power MOSFET drain contact region 320. The drain NLDD region 336 and the source NLDD region 338 are electrically isolated from the power MOSFET source region 316 through pn junctions 344 at boundaries between the drain NLDD region 336 and the source NLDD region 338 and the lightly doped substrate 308. An effective gate length of the diode-connected MOSFET 312, corresponding to a lateral distance between the drain NLDD region 336 and the source NLDD region 338, may be, for example, 0.5 to 2 microns. The edge gate 330 may overlap the diode-connected MOSFET drain NLDD region 336, as depicted in FIG. 3, and possibly the diode-connected MOSFET source NLDD region 338.

Metal interconnects are disposed over the substrate 302 so as to electrically connect elements of the power MOSFET 310 and the diode-connected MOSFET 312. A gate input node 346 of the semiconductor device 300 is directly connected to the diode-connected MOSFET source contact region 342. A drain input/output node 348 of the semiconductor device 300 is directly connected to the power MOSFET drain contact region 320. A source input/output node 350 of the semiconductor device 300 is directly connected to the source contact layer 328. The gate input node 346 is connected through a shunt resistor 352 to the diode-connected MOSFET gate structure 332. The diode-connected MOSFET gate structure 332 is directly connected to the diode-connected MOSFET drain contact region 340 and the power MOSFET gate structure 314. The power MOSFET source region 316 may be connected to the edge gate 330. Alternatively, the edge gate 330 may be biased by a separate voltage source. The source region 316 may be recessed as depicted in FIG. 3 so that source contact metal 358 makes electrical connection to the body region 322 and to the source region 316. The source contact metal 358 may extend over the power MOSFET source region 316 and over the power MOSFET gate structure 314, the edge gate 330 and the power MOSFET extended NLDD region 318, isolated by a dielectric layer, to form a field plate structure. The field plate may act as a shield electrode, decoupling the gate input node 346 from the drain input/output node 348. It may also help to deplete the LDD region when a positive bias is applied to the drain input/output node 348, advantageously improving hot carrier reliability of the power MOSFET 310.

Performance of the semiconductor device 300 may be enhanced by forming optional p-type heavily doped breakdown layers 354 disposed in the lightly doped substrate 308 under the diode-connected MOSFET drain contact region 340 and source contact region 342, at a lower boundary of the diode-connected MOSFET drain NLDD region 336 and at a lower boundary of the source NLDD region 338. An average doping density of the breakdown layers 354 is selected to provide a desired breakdown voltage of the pn junction at the boundary which is lower in magnitude than a breakdown voltage of the diode-connected MOSFET gate dielectric layer. For example, an average doping density above $5 \times 10^{17}$ $cm^{-3}$ will desirably provide a breakdown voltage determined by a doping density of the diode-connected MOSFET drain NLDD region 336 and source NLDD region 338 adjacent to the breakdown layers 354. During operation of the semiconductor device 300, junction breakdown induced by the breakdown layers 354 desirably provides protection against voltage transient damage and electrostatic discharge (ESD) damage to the power MOSFET gate dielectric layer. A shallow p-type breakdown layer 356 may be disposed directly under the power MOSFET source region 316 to improve an unclamped inductive switching (UIS) capability of the power MOSFET 310.

Figure 4A:
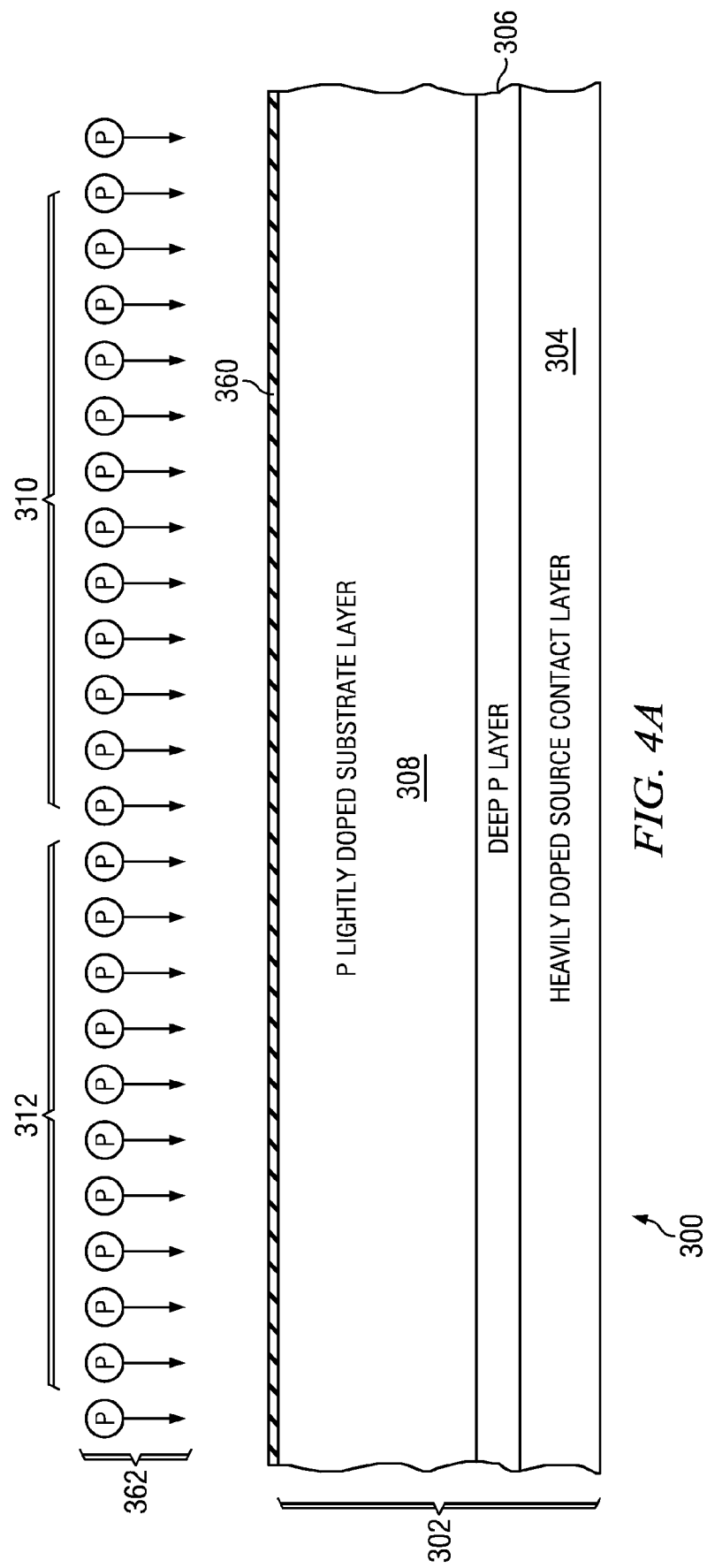
FIG. 4A through FIG. 4G are cross sections of the semiconductor device of FIG. 3, depicted in successive stages of fabrication.

FIG. 4A through FIG. 4G are cross sections of the semiconductor device of FIG. 3, depicted in successive stages of fabrication. Referring to FIG. 4A, the semiconductor device 300 starts with the p-type silicon substrate 302 which includes the heavily doped p-type source contact layer 304 at the bottom surface of the substrate 302. The source contact layer 304 may have an average doping density of $1 \times 10^{19}$ $cm^{-3}$ to $1 \times 10^{20}$ $cm^{-3}$. The lightly doped p-type substrate layer 308, 0.5 to 10 microns thick, at the top surface of the substrate 302 having an average doping density of $5 \times 10^{14}$ $cm^{-3}$ to $5 \times 10^{16}$ $cm^{-3}$ may be formed, for example, by an epitaxial process.

A layer of screen oxide 360 is formed over the substrate 302 so as to protect the top surface of the substrate 302 during a subsequent deep well implant process. The screen oxide 360 may include 20 to 100 nanometers of silicon dioxide, and be formed by thermal oxidation of the top surface of the substrate 302 or by decomposition of tetraethoxysilane (TEOS).

A blanket deep p-type implant process 362 is performed which ion implants p-type dopants such as boron at a dose of, for example, $3 \times 10^{12}$ $cm^{-2}$ to $3 \times 10^{13}$ $cm^{-2}$, at an energy of several hundred keV to over 1 MeV, into the substrate 302. A subsequent well anneal process heats the substrate 302, for example a furnace anneal at 800° C. for 30 minutes, to form the deep p-type layer 306 with an average doping density of, for example, $2 \times 10^{16}$ $cm^{-3}$ to $2 \times 10^{18}$ $cm^{-3}$.

Figure 4B:
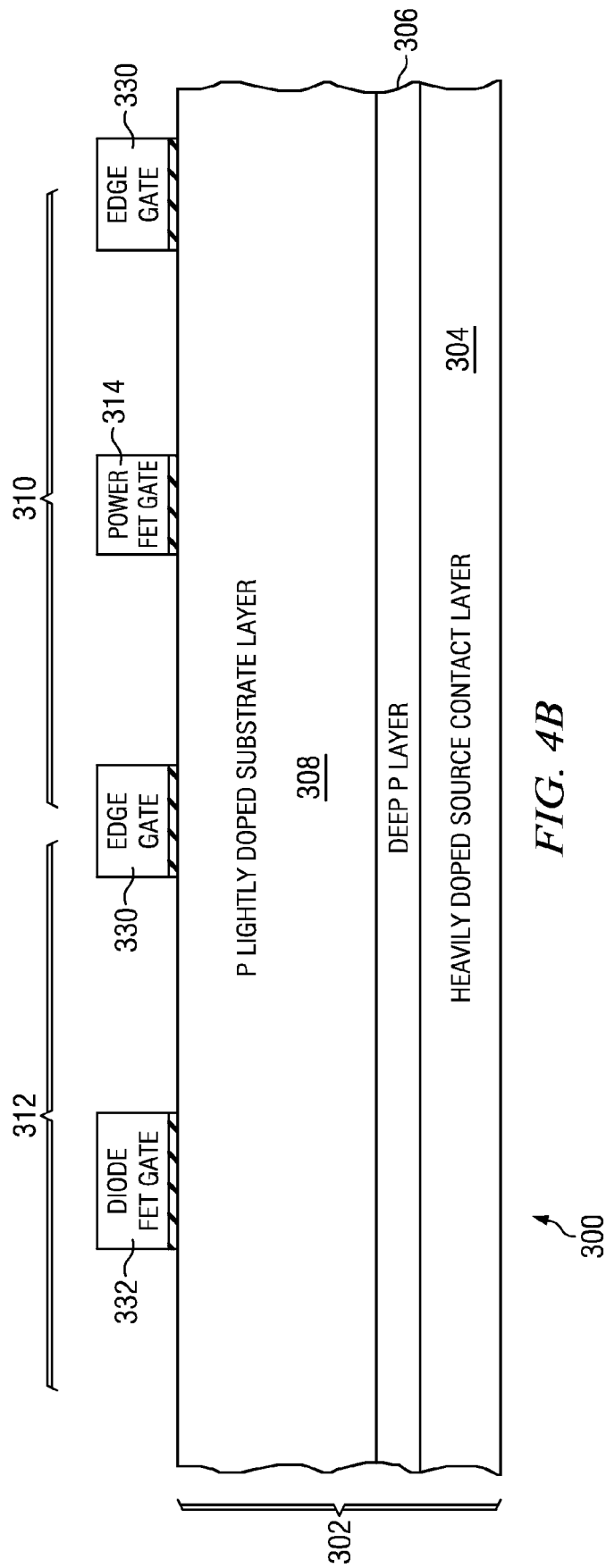

Referring to FIG. 4B, the power MOSFET gate structure 314, the edge gate 330 and the diode-connected MOSFET gate structure 332 are formed on the substrate 302. The gate dielectric layer of the power MOSFET gate structure 314 and the diode-connected MOSFET gate structure 332, and possibly the edge gate 330, may be one or more layers of silicon dioxide, silicon oxy-nitride, hafnium oxide, hafnium silicate, hafnium silicon oxy-nitride, zirconium oxide, zirconium silicate, zirconium silicon oxy-nitride, a combination of the aforementioned materials, or other insulating material. The gate dielectric layer may include nitrogen as a result of exposure to a nitrogen containing plasma or a nitrogen-containing ambient gas at temperatures between 500 C and 800 C. The gate dielectric layer may be, for example, 35 to 40 nanometers thick to support operation at 12 volts. The gate dielectric layer may be formed by any of a variety of gate dielectric formation processes, for example thermal oxidation, plasma nitridation of an oxide layer, and/or dielectric material deposition by atomic layer deposition (ALD). A thicker dielectric layer may be formed in areas defined for the edge gate 330.

A layer of gate material is formed on the gate dielectric layer. The gate material may include polycrystalline silicon 50 to 300 nanometers thick, titanium nitride 50 to 200 nanometers thick, tungsten silicide 50 to 200 nanometers thick, or other electrically conductive material suitable for MOSFET gates. An anti-reflection layer, for example 50 to 500 nanometers of silicon oxynitride, may be formed over the layer of gate material to improve a subsequent photolithographic step for forming a gate etch mask. The gate etch mask is formed over the gate layer so as to cover areas defined for the power MOSFET gate structure 314, the edge gate 330 and the diode-connected MOSFET gate structure 332. A gate etch process is performed which removes gate material in areas exposed by the gate mask so as to form the gates. For gate material which has a layer of polysilicon at a top surface, an optional layer of metal silicide may be formed at top surfaces of the gates and exposed silicon at the top surface of the substrate 302 by depositing a layer of metal, such as titanium, cobalt, or nickel, on an existing top surface of the semiconductor device 300, heating the semiconductor device 300 to react a portion of the metal with exposed silicon in the gates and the substrate 302, and selectively removing unreacted metal, commonly by exposing the semiconductor device 300 to wet etchants including a mixture of an acid and hydrogen peroxide.

Figure 4C:
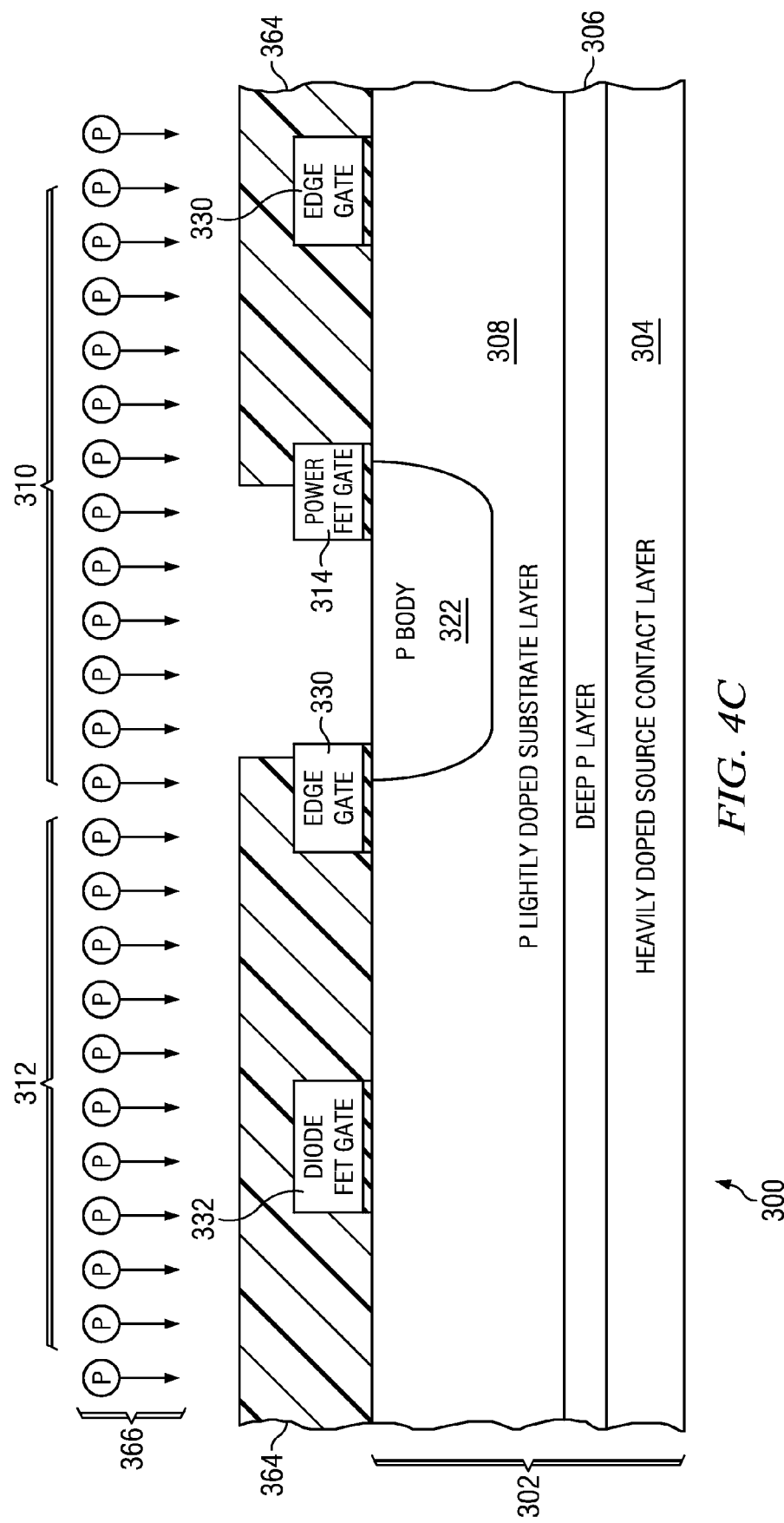

Referring to FIG. 4C, a body implant mask 364 is formed over the substrate 302 so as to expose an area for the p-type body region 322. A body region implant process 366 is performed which ion implants p-type dopants such as boron at a dose of, for example, $2 \times 10^{13}$ $cm^{-2}$ to $2 \times 10^{14}$ $cm^{-2}$, at an energy of 20 keV to 200 keV, into the substrate 302. The body implant mask 364 is removed after the body region implant process 366 is completed. A subsequent anneal, for example a furnace anneal of 1000° C. for 30 minutes, activates and diffuses the implanted dopants to form the body region 322 with an exemplary average doping density of $1 \times 10^{17}$ $cm^{-3}$ to $5 \times 10^{18}$ $cm^{-3}$.

Figure 4D:
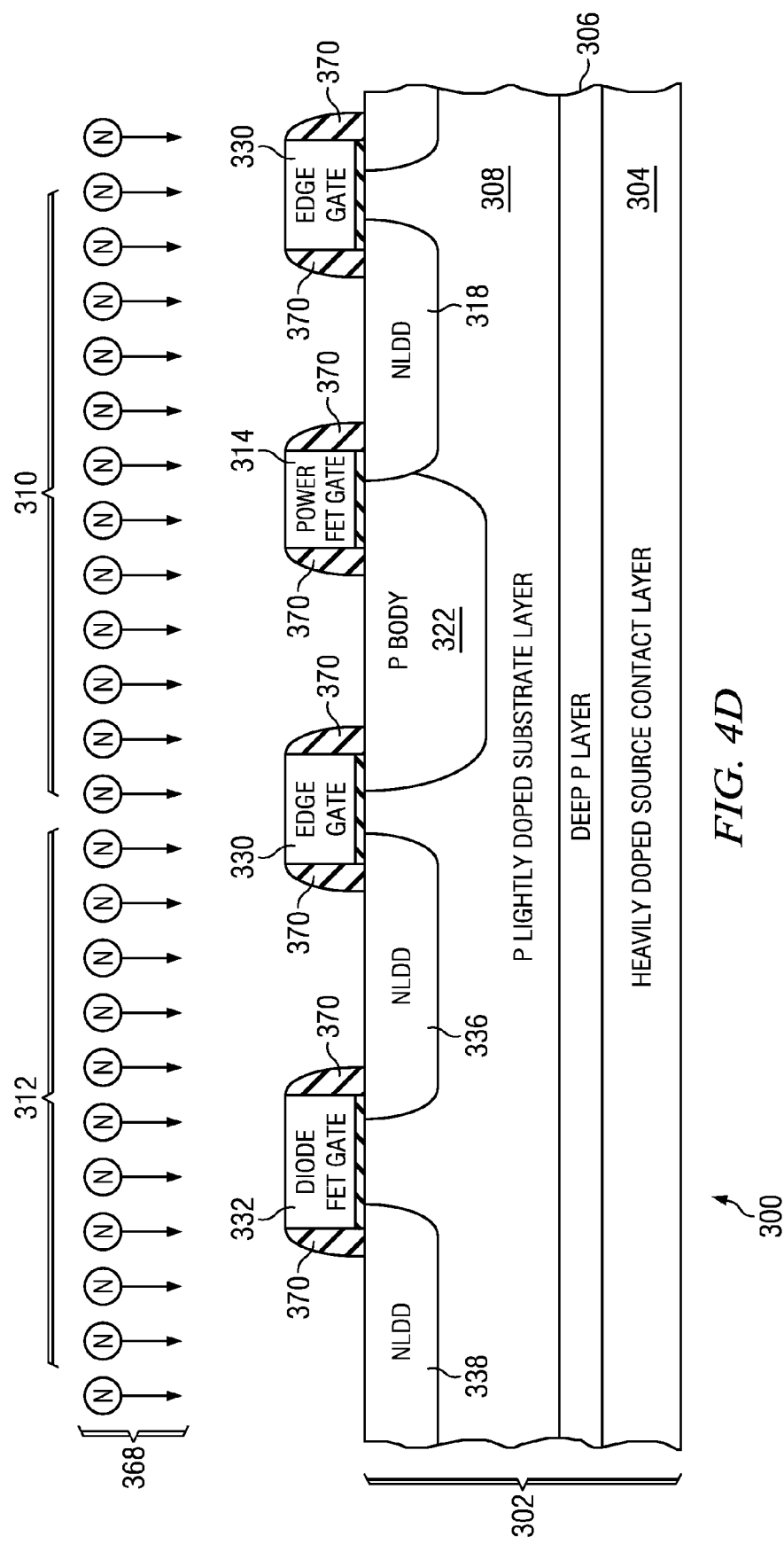

Referring to FIG. 4D, a blanket NLDD implant process 368 is performed which ion implants n-type dopants such as phosphorus into the substrate at a dose, for example, of $2 \times 10^{12}$ $cm^{-2}$ to $2 \times 10^{13}$ $cm^{-2}$, at an energy of 50 keV to 500 keV. An optional subsequent thermal anneal, for example at 1000° C. for 10 minutes, activates and diffuses the implanted dopants to form the power MOSFET extended NLDD region 318, the diode-connected MOSFET drain NLDD region 336 and the diode-connected MOSFET source NLDD region 338, with exemplary average doping densities of $1 \times 10^{16}$ $cm^{-3}$ to $4 \times 10^{17}$ $cm^{-3}$. Optional dielectric gate sidewall spacers 370 may be formed on lateral surfaces of the power MOSFET gate structure 314, the edge gate 330 and the diode-connected MOS- FET gate structure 332, for example by depositing a conformal layer of dielectric material such as silicon nitride or silicon dioxide over the gates and performing an anisotropic etch process which removes the dielectric material from top surfaces of the gates and the top surface of the substrate, leaving the gate sidewall spacers 370 abutting the gates structures 314 and 332 and the edge gate 330.

Figure 4E:
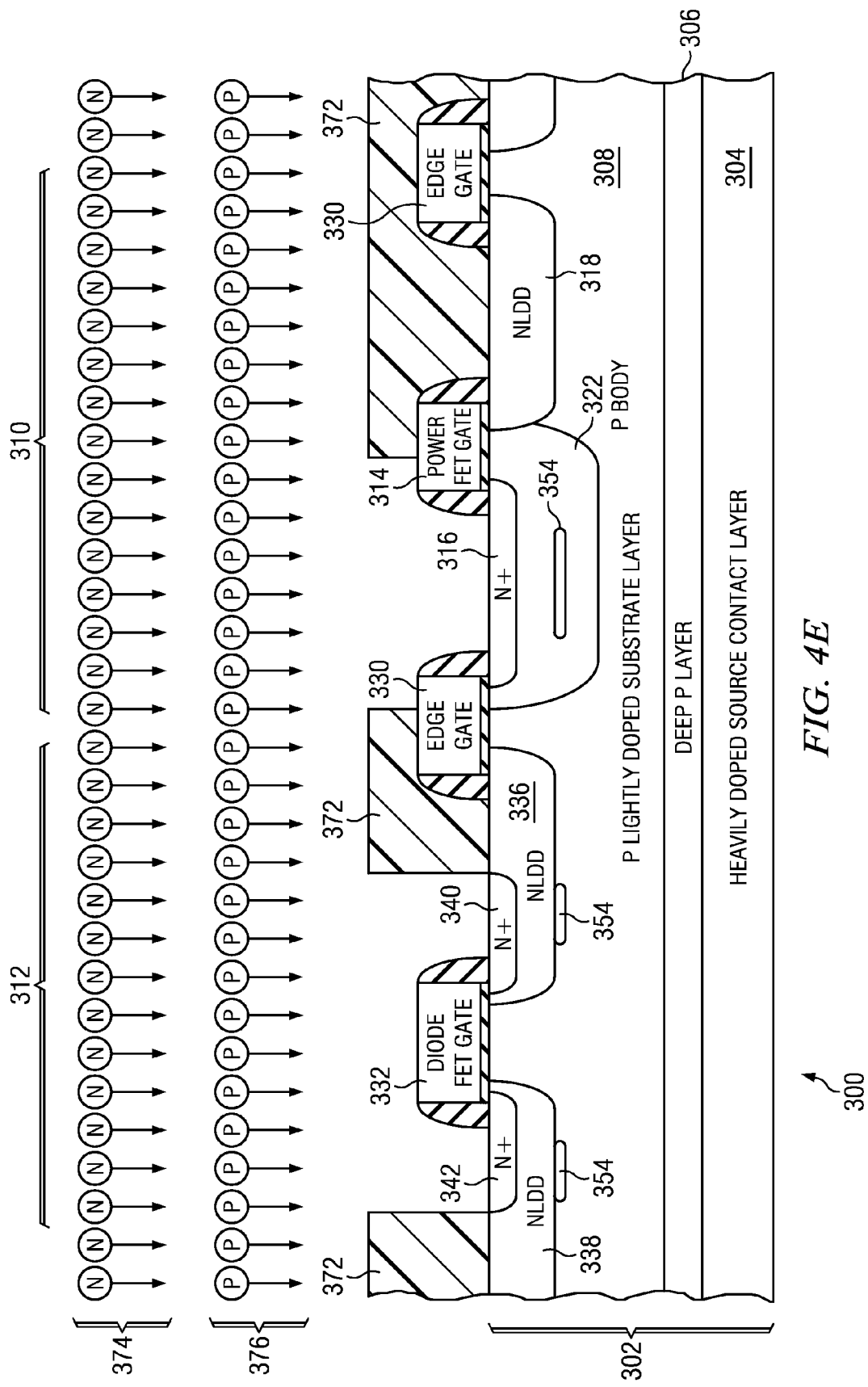

Referring to FIG. 4E, an n-channel contact implant mask 372 is formed over the semiconductor device 300 so as to expose areas defined for the power MOSFET source region 316, the diode-connected MOSFET drain contact region 340 and the diode-connected MOSFET source contact region 342. An n-channel contact implant process 374 is performed which ion implants n-type dopants such as phosphorus, arsenic and possibly antimony, into the substrate 302. The breakdown layers 354, if formed, may be formed by a p-type breakdown layer implant process 376 using the n-channel contact implant mask 372; the breakdown layer implant process 376 implants p-type dopants such as boron into the substrate 302 at bottom boundaries of the power MOSFET source region 316, the diode-connected MOSFET drain contact region 340 and the diode-connected MOSFET source contact region 342. The n-channel contact implant mask 372 is removed after the n-channel contact implant process 374 is completed. Subsequently, a thermal anneal operation is performed which heats the substrate 302 so as to activate and diffuse the implanted dopants and form the power MOSFET source region 316, the diode-connected MOSFET drain contact region 340 and the diode-connected MOSFET source contact region 342 with exemplary average doping densities of $5 \times 10^{19}$ cm$^{-3}$ to $5 \times 10^{20}$ cm$^{-3}$. The thermal anneal may be, for example, at 1000° C. for 10 minutes.

Figure 4F:
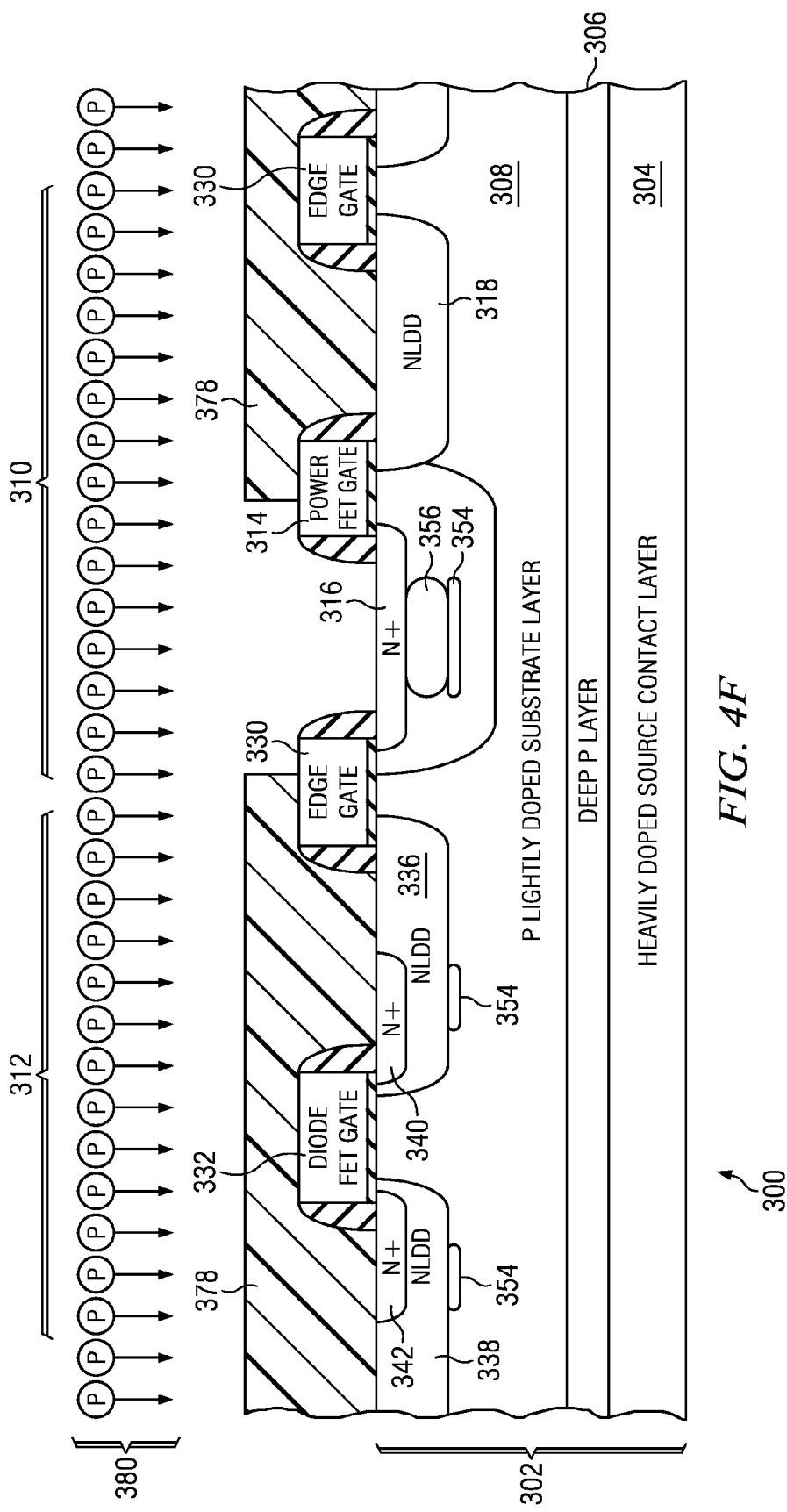

Referring to FIG. 4F, a shallow p-type layer mask 378 is formed over the semiconductor device 300 so as to expose the power MOSFET source region 316. A shallow p-type layer implant process 380 is performed which ion implants p-type dopants such as boron, into the substrate 302 at a bottom boundary of the power MOSFET source region 316. The shallow p-type layer mask 378 is removed after the shallow p-type layer implant process 380 is completed. A subsequent anneal activates the implanted p-type dopants of the shallow p-type layer implant process 380 to form a shallow p-type layer 356

Figure 4G:
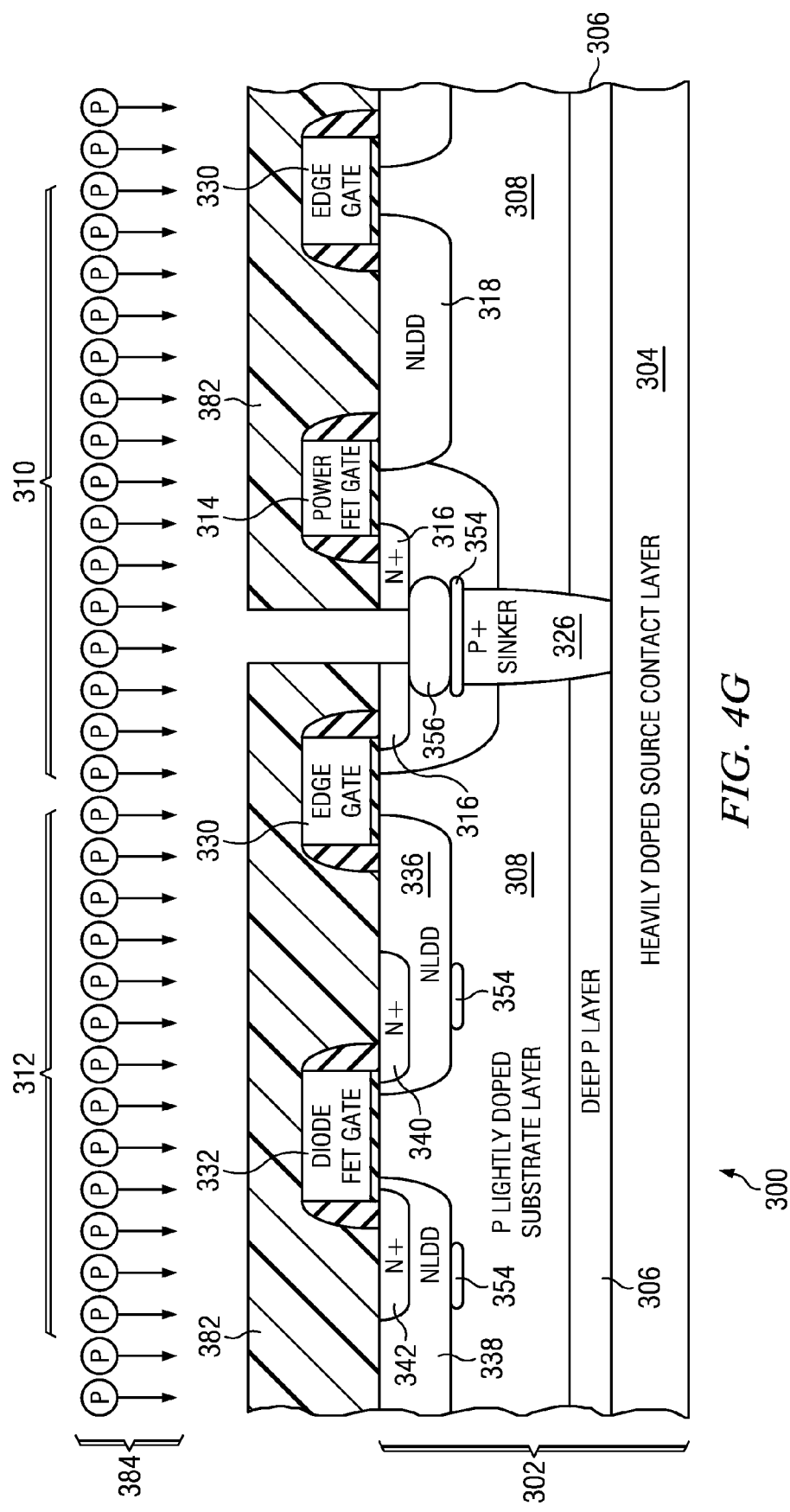

Referring to FIG. 4G, a sinker implant mask 382 is formed over the semiconductor device 300 so as to expose a portion of the power MOSFET source region 316. Material is removed from the substrate 302 in the area exposed by the sinker implant mask 382 so as to expose p-type semiconductor material under the power MOSFET source region 316, for example the shallow p-type layer 356. A sinker implant process 384 is performed which ion implants p-type dopants such as boron at a dose of, for example, $5 \times 10^{13}$ cm$^{-2}$ to $5 \times 10^{14}$ cm$^{-2}$, into the lightly doped substrate layer 308 between the breakdown layer 354 and the source contact layer 304. The sinker implant mask 382 is removed after the sinker implant process 384 is completed. Subsequently, a thermal anneal operation, is performed which heats the substrate 302 so as to activate and diffuse the implanted dopants and form the sinker 326. The thermal anneal may be, for example, at 1000° C. for 10 minutes. An average doping density of the sinker 326 may be, for example, with an average doping density, for example, of $5 \times 10^{16}$ cm$^{-3}$ to $1 \times 10^{19}$ cm$^{-3}$.

Subsequently, the power MOSFET drain contact region 320 is formed in the NLDD region 318. The metal interconnects described in reference to FIG. 3 are formed. A portion of the substrate 302 is removed from the bottom, for example by backgrinding, to thin the semiconductor device 300. The metal source contact layer 328 of FIG. 3 is formed on the bottom surface of the thinned substrate 302, to form the completed semiconductor device 300 depicted in FIG. 3.

Figure 5:
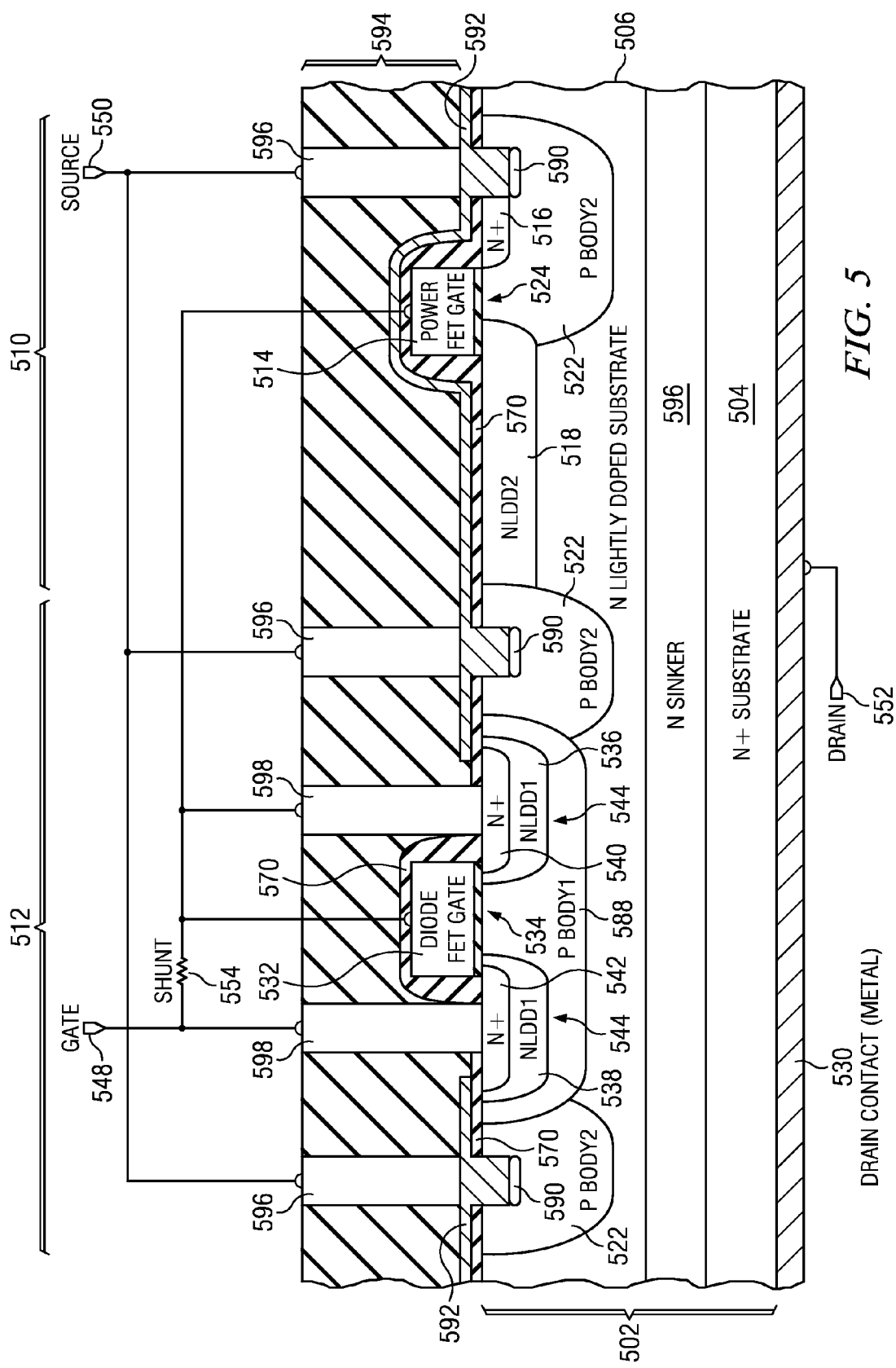
FIG. 5 is a cross section of a semiconductor device containing a vertical re-channel power MOSFET in a drain-down configuration with a gate connected through a parallel shunt resistor and diode-connected MOSFET.

FIG. 5 is a cross section of a semiconductor device containing a vertical n-channel power MOSFET in a drain-down configuration with a gate connected through a parallel shunt resistor and diode-connected MOSFET. It will be recognized that a p-channel version may be realized by appropriate changes of polarity of elements of the semiconductor device. The semiconductor device 500 is formed in and on an n-type semiconductor substrate 502 and includes a heavily doped n-type drain contact layer 504 at a bottom surface of the substrate 502, with 0.5 to 10 microns of lightly doped n-type substrate material 506 at a top surface of the substrate 502. An n-type sinker layer 598 is disposed between the drain contact layer 504 and the lightly doped substrate material 506. The sinker layer 598 has an average doping density between the doping densities of the drain contact layer 504 and the lightly doped substrate material 506. The semiconductor device 500 includes an area defined for the power MOSFET 510 and an area defined for the diode-connected MOSFET 512 proximate to the power MOSFET 510.

The diode-connected MOSFET 512 has a gate structure 532 which has the same layer structure as the diode-connected MOSFET gate structure 332 of FIG. 3. The diode-connected MOSFET 512 includes an n-type drain NLDD region 536 and an n-type source NLDD region 538 adjacent to, and on opposite sides of, the diode-connected MOSFET gate structure 532. The drain NLDD region 536 and the source NLDD region 538 are contained in a first p-type body region 588 which extends to a channel region 534 at the top surface of the substrate 502 under the diode-connected MOSFET gate structure 532. The drain NLDD region 536 contains an n-type drain contact region 540 and the source NLDD region 538 contains an n-type source contact region 542. An effective gate length of the diode-connected MOSFET 512, corresponding to a lateral distance between the drain NLDD region 536 and the source NLDD region 538, may be, for example, 0.5 to 2 microns. A second p-type body region 522 is disposed in the substrate 502 abutting and making electrical connection to the first body region 588. P-type body contact regions 590 are disposed in the second body region 522 to provide electrical connections to the first body region 588 and the second body region 522.

The power MOSFET 510 has a gate structure 514 with the same layer structure as the diode-connected MOSFET gate structure 532. The power MOSFET 510 includes an n-type source region 516 in the substrate 502 adjacent to the power MOSFET gate structure 514. The power MOSFET source region 516 has an average doping density substantially equal to the diode-connected MOSFET drain contact region 540 and source contact region 542. The power MOSFET 510 further includes an n-type extended NLDD region 518 in the substrate 502 adjacent to the power MOSFET gate structure 514 opposite from the source region 516. The power MOSFET extended NLDD region 518 has an average doping density substantially equal to the diode-connected MOSFET drain NLDD region 536 and the source NLDD region 538. A portion of the second body region 522 is disposed in the power MOSFET 510 and extends to a channel region 524 under the power MOSFET gate structure 514, abutting the extended NLDD region 518, and surrounding and isolating the source region 516. An instance of the p-type body contact regions 590 is disposed in the portion of the second body region 522 in the power MOSFET 510 adjacent to the power MOSFET source region 516. An effective gate length of the power MOSFET 510, corresponding to a lateral distance between the source region 516 and the extended NLDD region 518, may be, for example, 0.3 to 1 micron. The extended NLDD region 518 is electrically connected through the lightly doped n-type substrate material 506 to the drain contact layer 504. A metal drain contact layer 530 is disposed on the bottom surface of the substrate 502.

The diode-connected MOSFET drain NLDD region 536 and source NLDD region 538 are electrically isolated from the power MOSFET drain contact layer 504 through pn junctions 544 at boundaries between the diode-connected MOSFET drain NLDD region 536 and the source NLDD region 538 and the first body region 588. The first body region 588 is electrically connected to the portion of the second body region 522 in the power MOSFET 510. In one version of the instant embodiment, the first body region 588 may be electrically connected to the power MOSFET body region 522 through a continuous segment of p-type region in the substrate 502. In another version, the first body region 588 may be electrically connected to the power MOSFET body region 522 through a metal interconnect over the substrate 502 of the semiconductor device 500.

A dielectric cap layer 570, which may include gate sidewall spacers abutting the power MOSFET gate structure 514 and the diode-connected MOSFET gate structure 532, is formed over the substrate 502. Electrical connections to the p-type body contact regions 590 may be recessed into the substrate 502, and metal silicide may be disposed in the recesses. A metal layer 592, possibly used to form the metal silicide, extends over the power MOSFET extended NLDD region 518, and over boundaries between the diode-connected MOSFET drain NLDD region 536 and source NLDD region 538 and the first body region 588. An interlevel dielectric (ILD) layer 594 is disposed over the metal layer 592 and dielectric cap layer 570. Body contacts 600 are disposed through the ILD layer 594 so as to make electrical connections to the p-type body contact regions 590. Source/drain contacts 602 are disposed through the ILD layer 594 so as to make electrical connections to the diode-connected MOSFET drain contact region 540 and source contact region 542.

Metal interconnects are disposed over the substrate 502 so as to electrically connect elements of the power MOSFET 510 and the diode-connected MOSFET 512. A gate input node 548 of the semiconductor device 500 is electrically coupled to the diode-connected MOSFET drain contact region 540 through a source/drain contact 602. A source input/output node 550 of the semiconductor device 500 is electrically coupled to the power MOSFET source region 516 through a body contact 600. A drain input/output node 552 of the semiconductor device 500 is directly connected to the drain contact layer 530. The gate input node 548 is connected through a shunt resistor 554 to the diode-connected MOSFET gate structure 532. The diode-connected MOSFET gate structure 532 is electrically coupled to the diode-connected MOSFET source contact region 542 and the power MOSFET gate structure 514. The source input/output node 550 is electrically coupled to the second body region 522 through one or more body contacts 600.

Figure 6A:
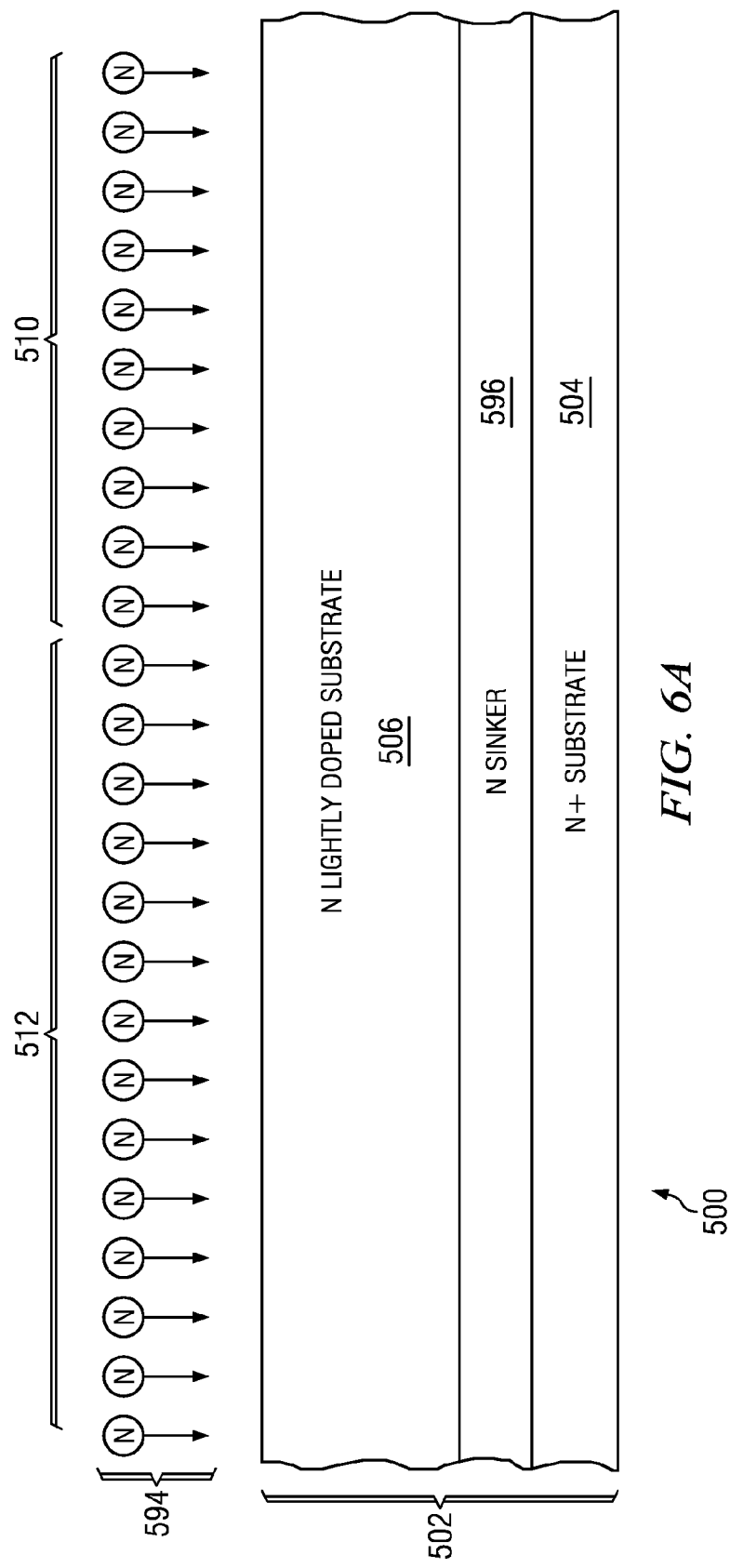
FIG. 6A through FIG. 6K are cross sections of the semiconductor device of FIG. 5, depicted in successive stages of fabrication.

FIG. 6A through FIG. 6K are cross sections of the semiconductor device of FIG. 5, depicted in successive stages of fabrication. Referring to FIG. 6A, the semiconductor device 500 starts with the n-type silicon substrate 502 which includes the heavily doped n-type drain contact layer 504 at the bottom surface of the substrate 502. The drain contact layer 504 may have an average doping density of $1 \times 10^{19}$ cm$^{-3}$ to $5 \times 10^{20}$ cm$^{-3}$. The lightly doped n-type substrate layer 506, 0.5 to 10 microns thick, at the top surface of the substrate 502 having an average doping density of $1 \times 10^{15}$ cm$^{-3}$ to $1 \times 10^{17}$ cm$^{-3}$ may be formed, for example, by an epitaxial process.

An n-type sinker implant process 596 is performed which ion implants n-type dopants such as phosphorus at a dose of, for example, $2 \times 10^{12}$ cm$^{-2}$ to $2 \times 10^{13}$ cm$^{-2}$, at an energy of 200 keV to 1200 keV, into the substrate 502 in the power MOSFET 510 area and the diode-connected MOSFET 512 area, proximate to a boundary between the lightly doped substrate layer 506 and the drain contact layer 504. The sinker implant process 596 may be a blanket implant or may be masked by a sinker implant mask which blocks the sinker dopants in areas outside the power MOSFET 510 area and the diode-connected MOSFET 512 area. A subsequent thermal anneal, for example at 850° C. for 30 minutes, activates and diffuses the implanted dopants to form the n-type sinker layer 598.

Figure 6B:
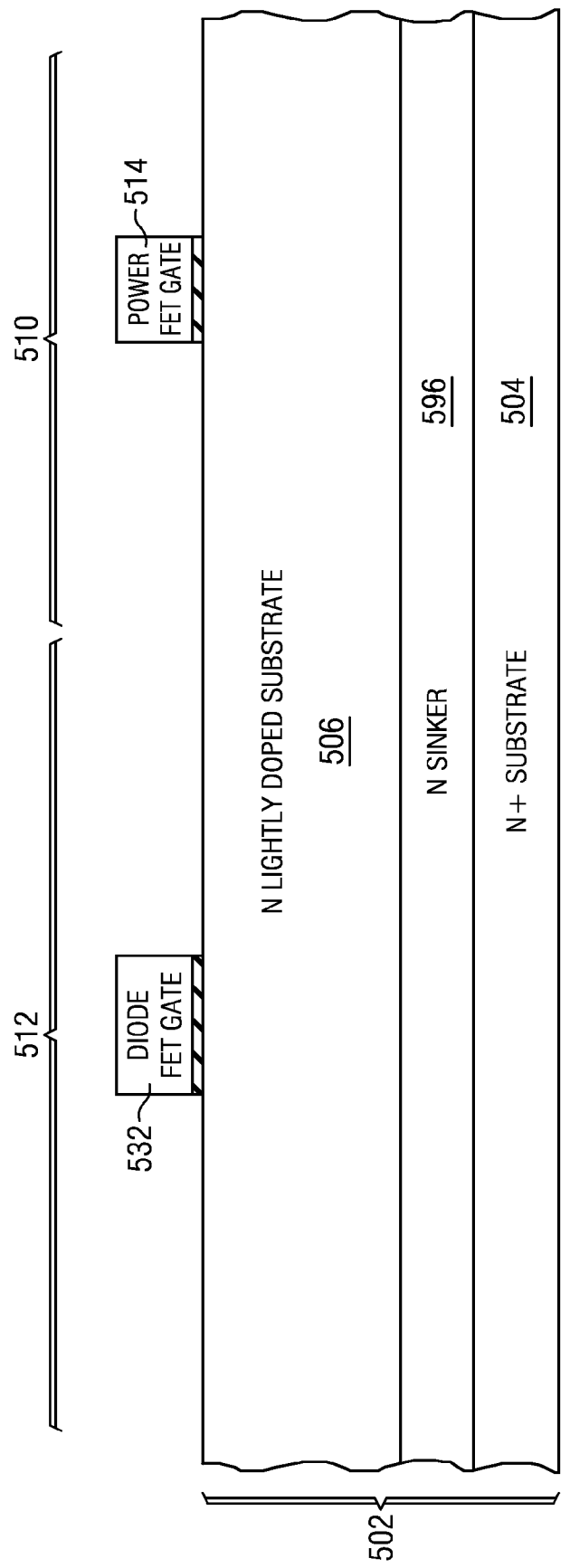

Referring to FIG. 6B, the power MOSFET gate structure 514 and the diode-connected MOSFET gate structure 532 are formed on the substrate 502, for example as described in reference to FIG. 4F. Optional field plate elements, not shown, may be formed concurrently with the power MOSFET gate structure 514 and the diode-connected MOSFET gate structure 532.

Figure 6C:
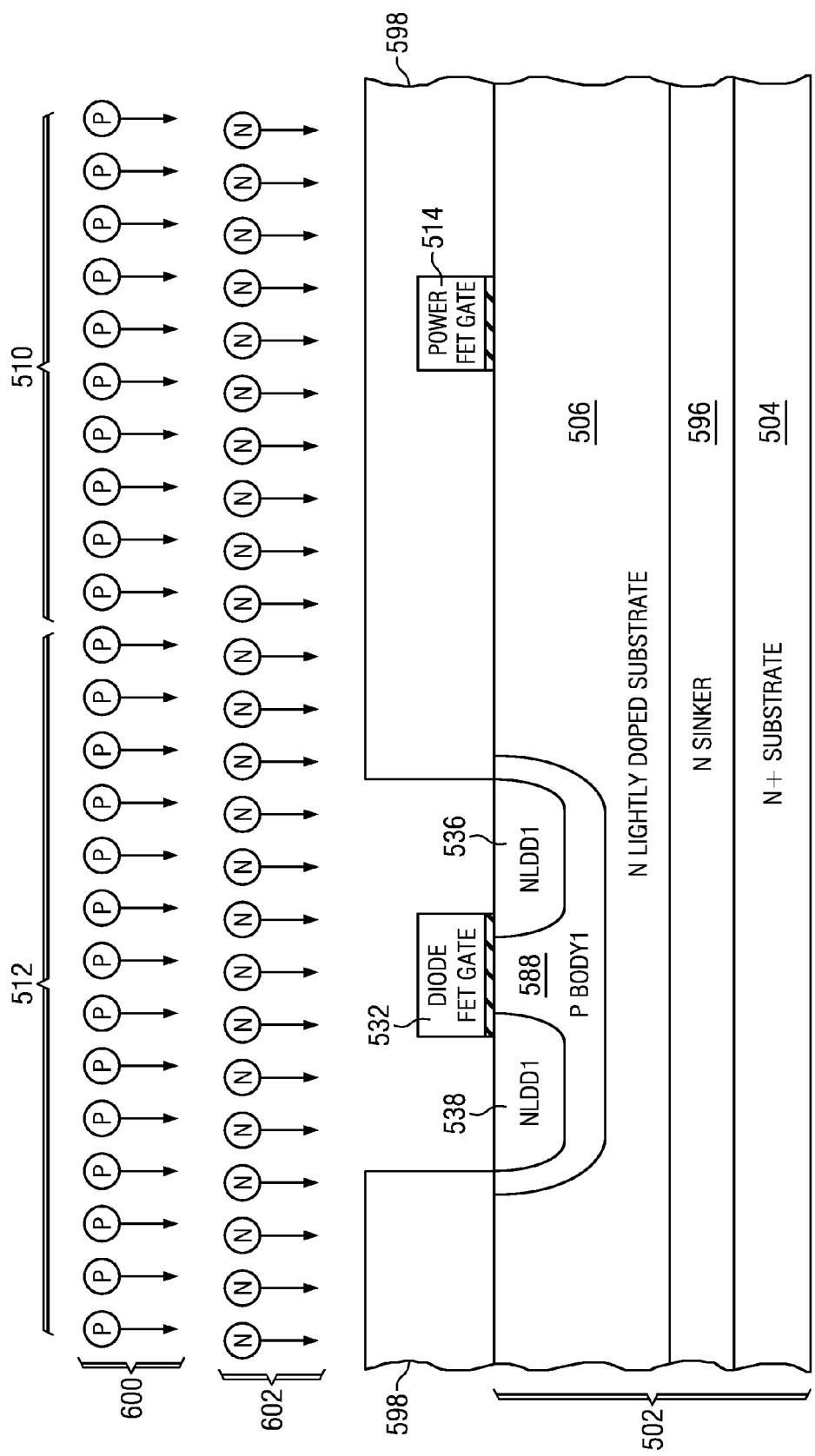

Referring to FIG. 6C, a first p-type body implant mask 604 is formed over the semiconductor device 500 so as to expose an area in the diode-connected MOSFET 512 defined for the first body region 588. A p-type first body implant process 606 is performed which ion implants p-type dopants such as boron at a dose of, for example, $2 \times 10^{12}$ cm$^{-2}$ to $1 \times 10^{14}$ cm$^{-2}$, at an energy of 40 keV to 500 keV, into the substrate 502. A first NLDD implant process 608 is performed which ion implants n-type dopants such as phosphorus into the substrate, using the first body implant mask 604, at a dose, for example, of $2 \times 10^{12}$ cm$^{-2}$ to $2 \times 10^{13}$ cm$^{-2}$, at an energy of 40 keV to 300 keV. The p-type contact implant mask 576 is removed after the p-type contact implant process 578 and the first NLDD implant process 608 are completed. An optional subsequent anneal, for example at 1000° C. for 20 minutes, activates and diffuses the implanted dopants to form the first body region 588 with an exemplary average doping density of $5 \times 10^{16}$ cm$^{-3}$ to $2 \times 10^{18}$ cm$^{-3}$ and form the diode-connected MOSFET drain NLDD region 536 and the diode-connected MOSFET source NLDD region 538, with exemplary average doping densities of $5 \times 10^{16}$ cm$^{-3}$ to $2 \times 10^{18}$ cm$^{-3}$.

Figure 6D:
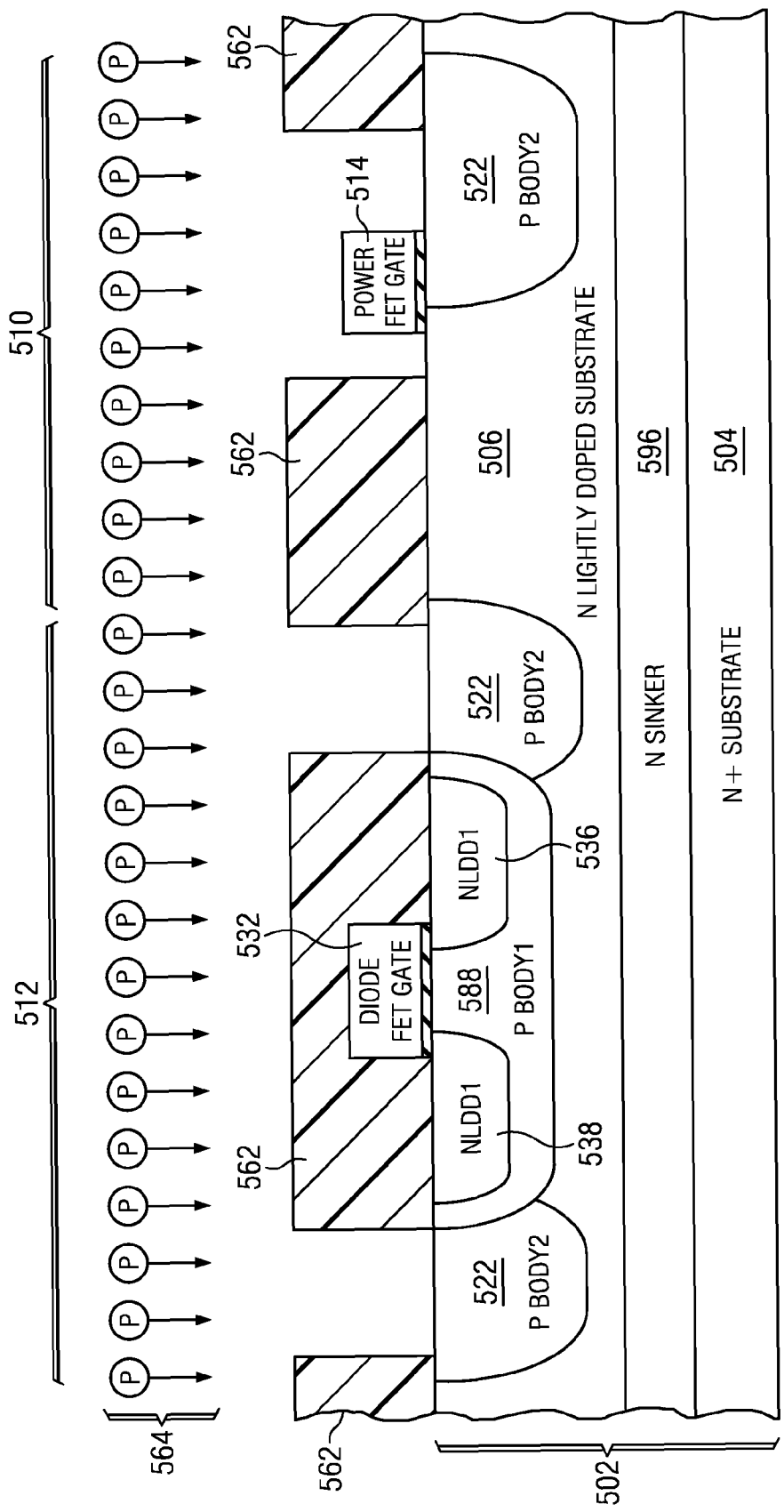

Referring to FIG. 6D, a second p-type body mask 562 is formed over the semiconductor device 500 so as to expose areas in the diode-connected MOSFET 512 and the power MOSFET 510 defined for the second body region 522. A p-type second body implant process 564 is performed which ion implants p-type dopants such as boron at a dose of, for example, $5 \times 10^{12}$ cm$^{-2}$ to $5 \times 10^{13}$ cm$^{-2}$, at an energy of 40 keV to 800 keV, into the substrate 502. The second body mask 562 is removed after the second body implant process 564 is completed. A subsequent thermal anneal activates and diffuses the implanted dopants to form the second body regions 522 with an exemplary average doping density of $2 \times 10^{16}$ cm$^{-3}$ to $2 \times 10^{18}$ cm$^{-3}$. The anneal to form the second body regions 522 may be performed concurrently with the anneal described in reference to FIG. 6C to form the first body region 588.

Figure 6E:
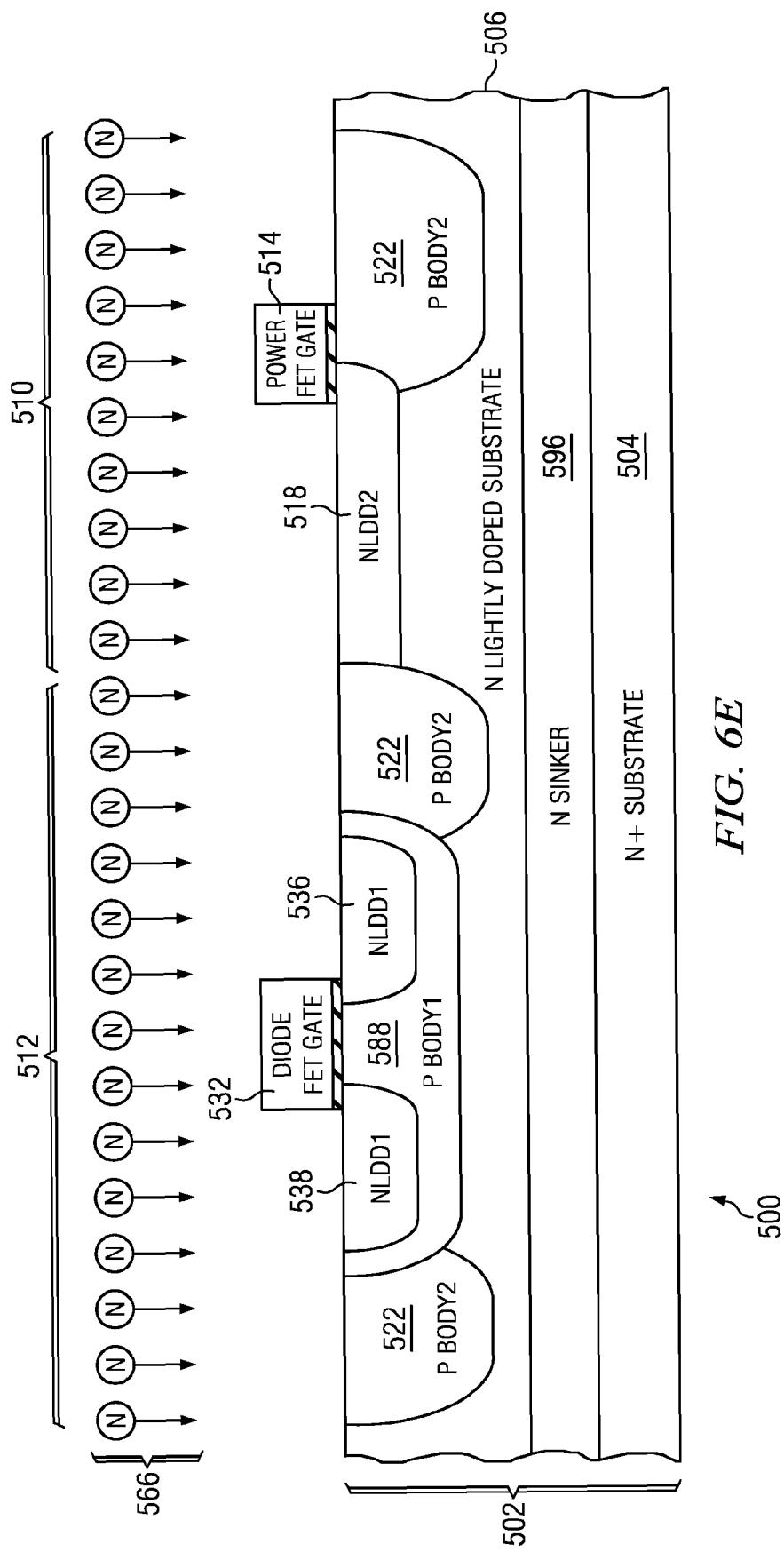

Referring to FIG. 6E, a blanket second NLDD implant process 386 is performed which ion implants n-type dopants such as phosphorus into the substrate at a dose, for example, of $5 \times 10^{11}$ cm$^{-2}$ to $4 \times 10^{13}$ cm$^{-2}$, at an energy of 40 keV to 200 keV. An optional subsequent thermal anneal, for example a rapid thermal processor (RTP) anneal of 1000° C. for 30 seconds, activates the implanted dopants to form the power MOSFET extended NLDD region 518 with exemplary average doping densities of $1 \times 10^{16}$ cm$^{-3}$ to $5 \times 10^{17}$ cm$^{-3}$.

Figure 6F:
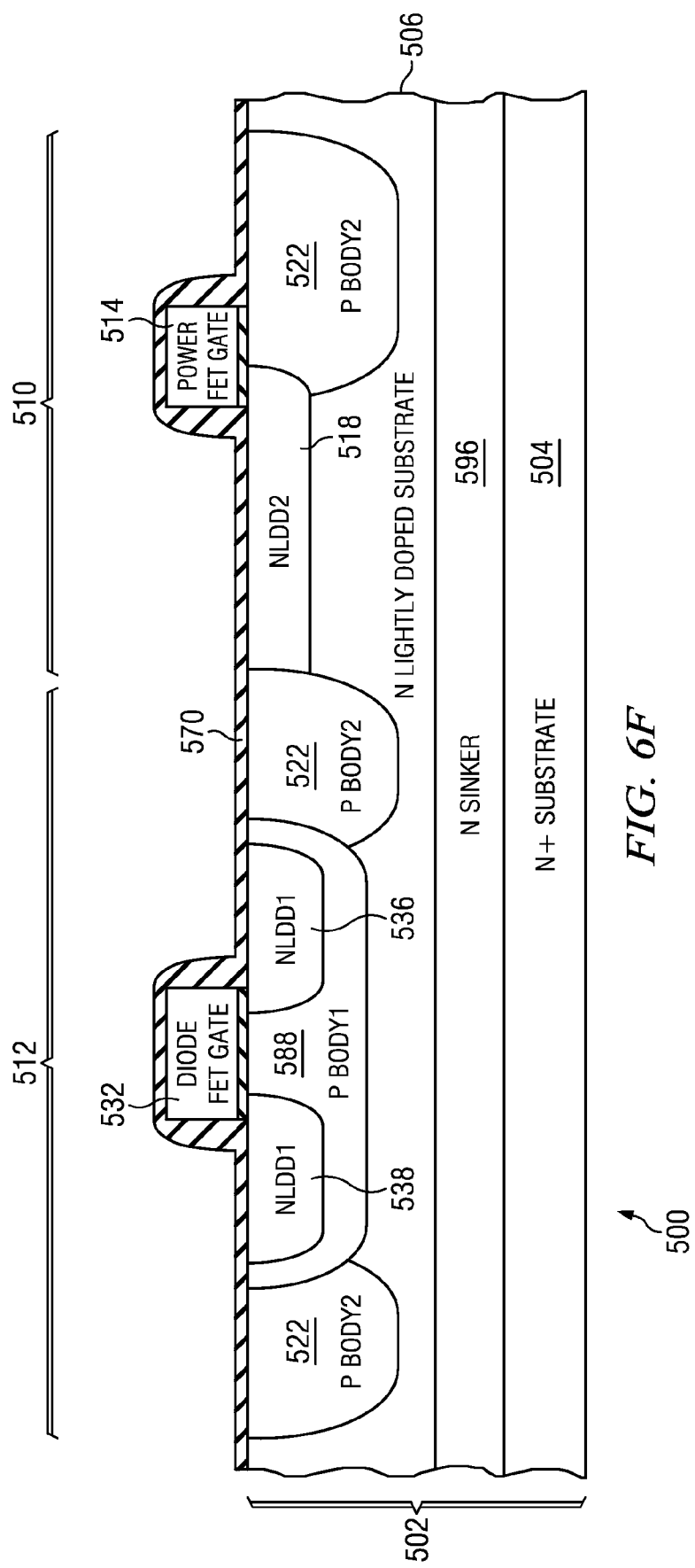

Referring to FIG. 6F, dielectric cap layer 570 is formed over substrate 502 and the power MOSFET gate structure 514 and the diode-connected MOSFET gate structure 532. The dielectric cap layer 570 may include dielectric sidewall spacers as described in reference to FIG. 4D. The dielectric cap layer 570 may include a layer of silicon dioxide, for example 50 to 200 nanometers thick, formed by a plasma enhanced chemical vapor deposition (PECVD) process using TEOS.

Figure 6G:
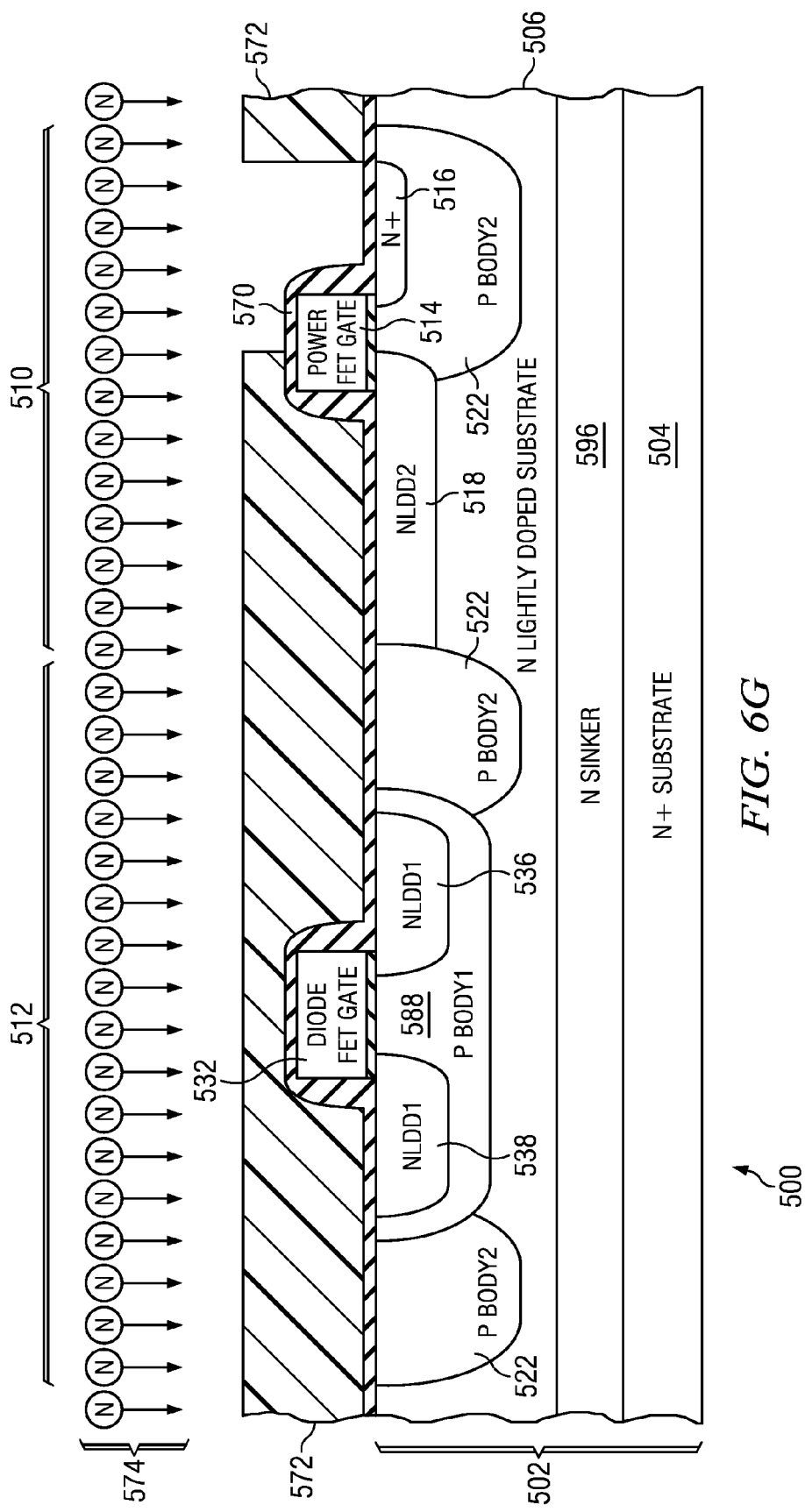

Referring to FIG. 6G, a power MOSFET source contact implant mask 572 is formed over the semiconductor device 500 so as to expose an area defined for the power MOSFET source region 516. A power MOSFET source contact implant process 574 is performed which ion implants n-type dopants such as phosphorus, arsenic and possibly antimony, through the dielectric cap layer 570 into the substrate 502. The power MOSFET source contact implant mask 572 is removed after the power MOSFET source contact implant process 574 is completed. Subsequently, an anneal operation, such as a furnace anneal, is performed which heats the substrate 502 so as to activate and diffuse the implanted dopants and form the power MOSFET source region 516 with an exemplary average doping density of $5 \times 10^{19}$ cm$^{-3}$ to $5 \times 10^{20}$ cm$^{-3}$. The anneal may be, for example, at 1050° C. for 10 minutes.

Figure 6H:
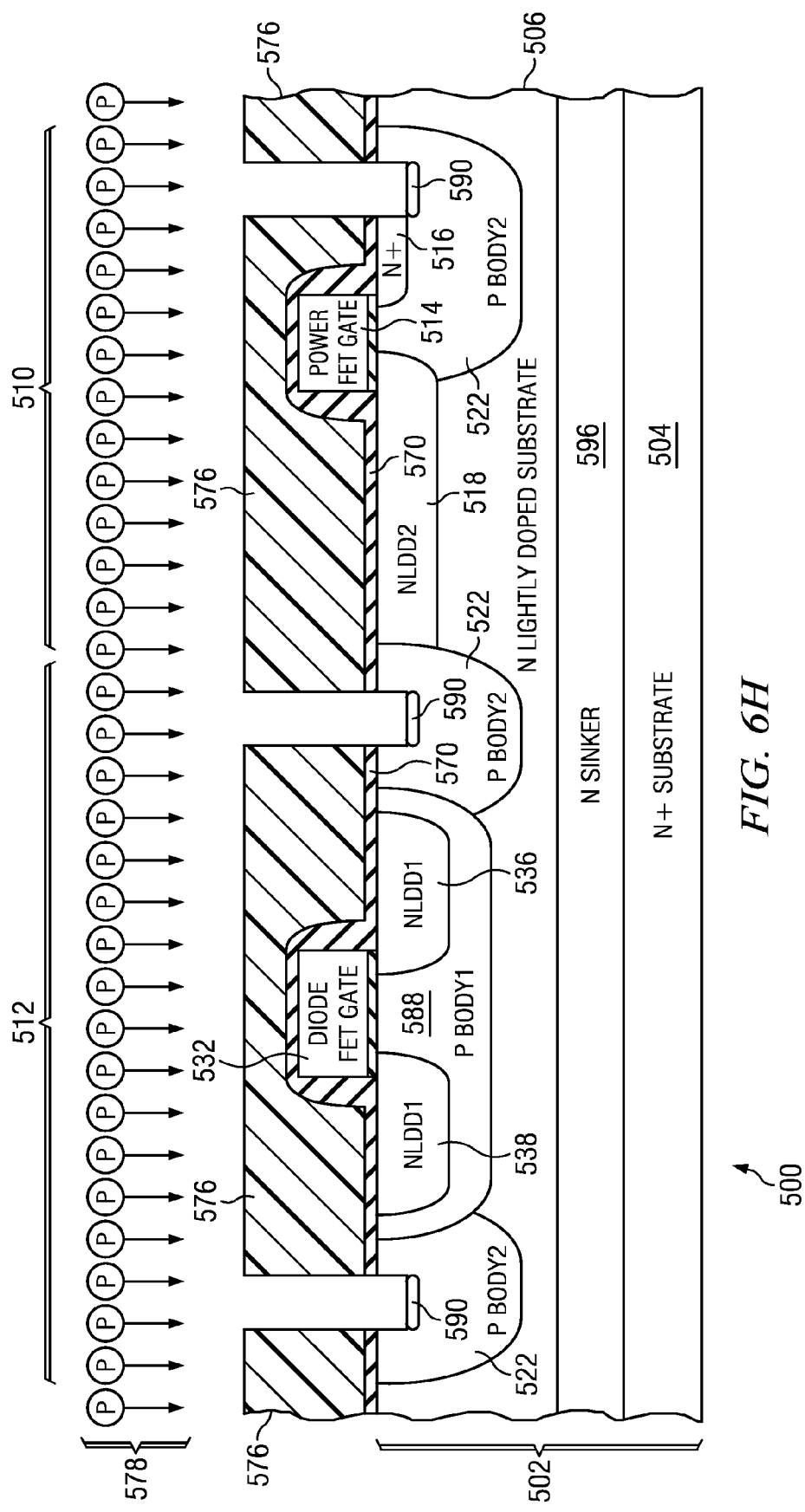

Referring to FIG. 6H, a p-type contact implant mask 576 is formed over the semiconductor device 500 so as to expose areas defined for the body contact regions 590. A body contact etch process is performed which removes the dielectric cap layer 570 and removes material from the substrate 502, in the areas exposed by the contact implant mask 576. A p-type contact implant process 578 is performed which ion implants p-type dopants such as boron and/or BF$_2$, and possibly gallium, into the substrate 502. The p-type contact implant mask 576 is removed after the p-type contact implant process 578 is completed. Subsequently, an anneal operation, is performed which heats the substrate 502 so as to activate the implanted dopants and form the body contact regions 590 with exemplary average doping densities of $5 \times 10^{19}$ cm$^{-3}$ to $5 \times 10^{20}$ cm$^{-3}$. The anneal may be performed concurrently with the n-channel contact anneal process described in reference to FIG. 6D.

Figure 6I:
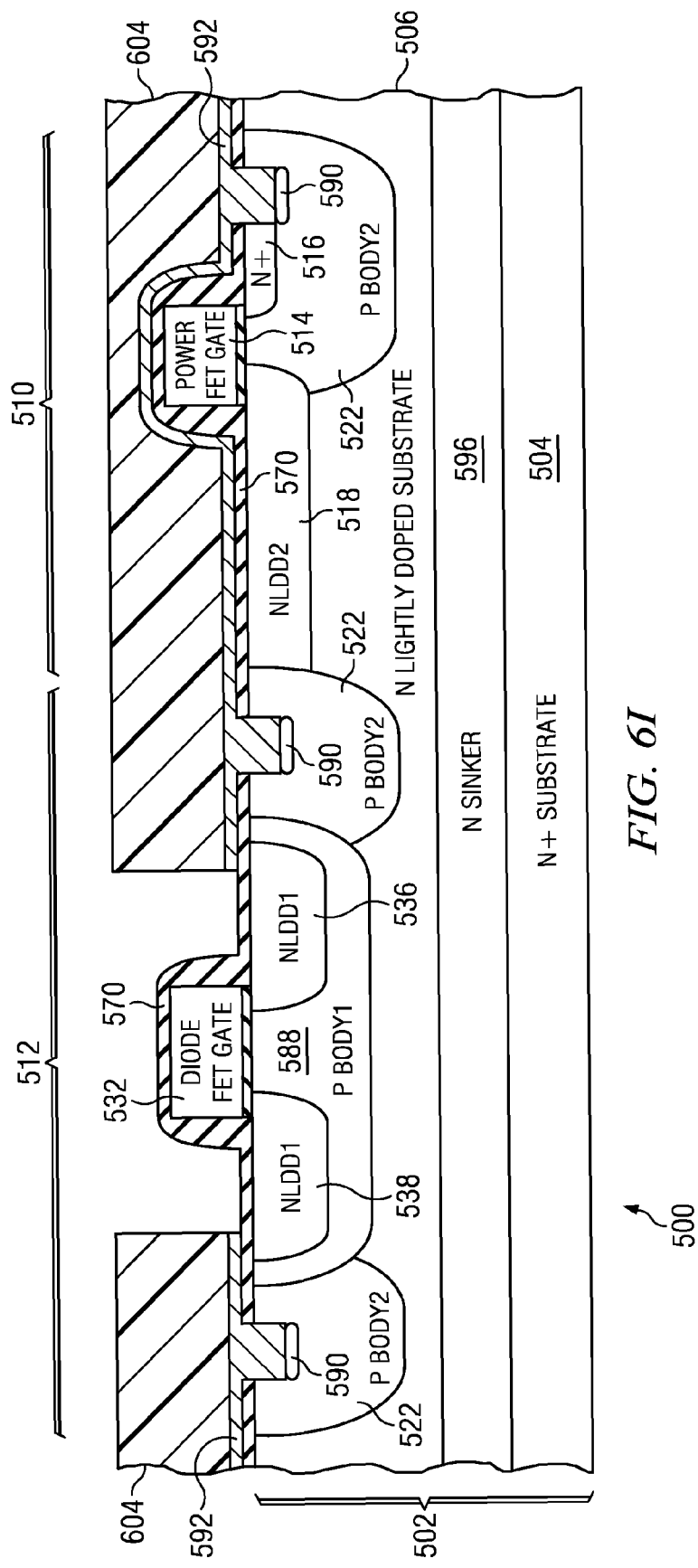

Referring to FIG. 6I, the metal layer 592 is formed over the dielectric cap layer 570 and in the etched areas described in reference to FIG. 6H, so as to make electrical contact with the body contact regions 590. The metal layer 592 may include, for example, titanium and titanium nitride. The substrate 502 and the metal layer 592 are heated, for example using an RTP process, so as to react the metal layer 592 with exposed silicon at the body contact regions 590 to form metal silicide. Metal silicide desirably reduces electrical impedance between the metal layer 592 and the body contact regions 590. A metal etch mask 610 is formed over the metal layer 592 so as to cover areas for the final metal layer 592. A metal etch process is performed which removes the metal layer 592 in areas exposed by the metal etch mask 610. The metal etch mask 610 is removed after the metal etch process is completed.

Figure 6J:
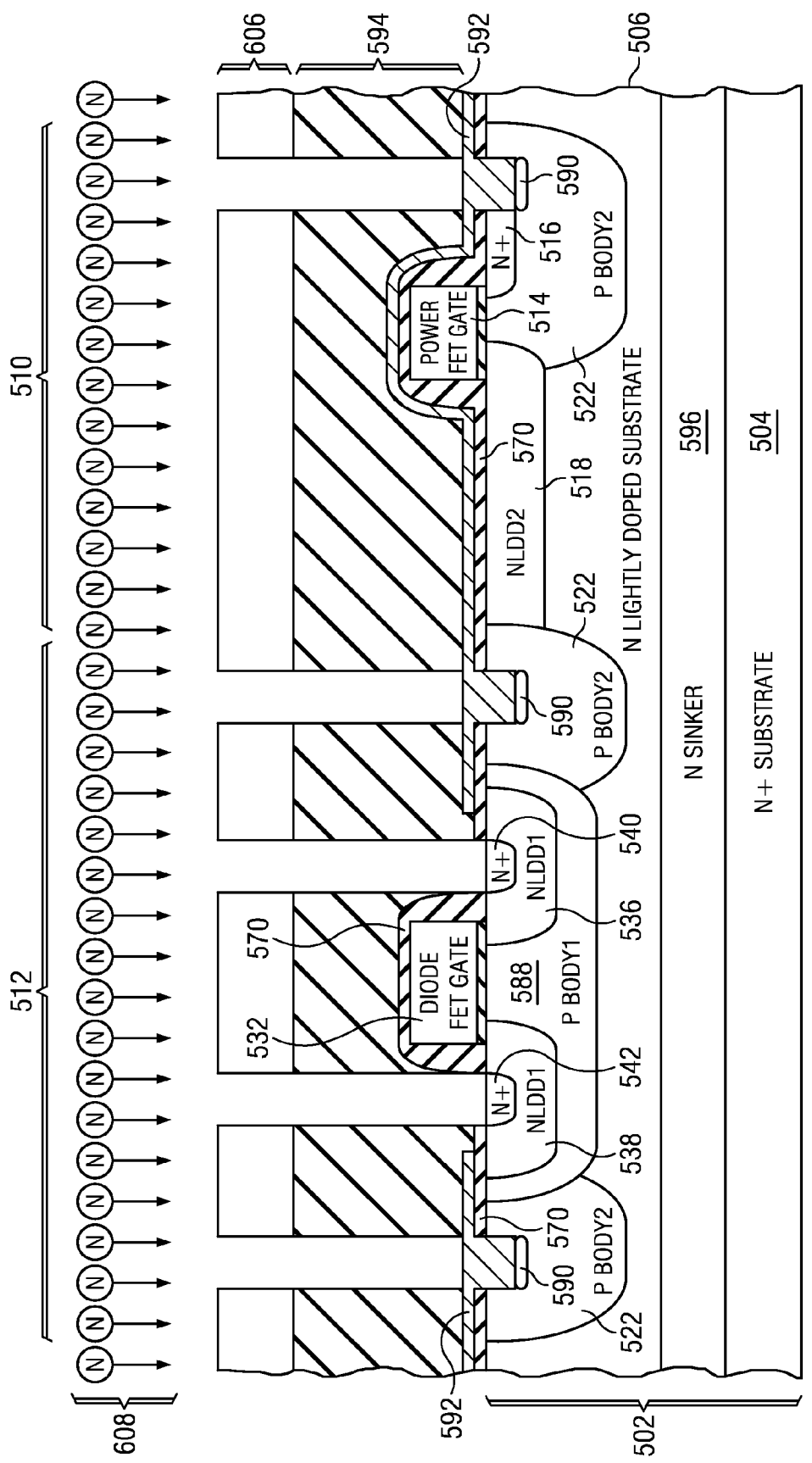

Referring to FIG. 6J, the ILD layer 594 is formed over the metal layer 592 and dielectric cap layer 570. The ILD layer 594 may be, for example, 50 to 200 nanometers thick and may include one or more layers of silicon dioxide and/or silicon nitride, formed by PECVD. A contact etch mask 612 is formed over the ILD layer 594 so as to expose areas for the body contacts 600 and the source/drain contacts 602 described in reference to FIG. 5. A contact etch process is performed which removes material from the ILD layer 594 and the dielectric cap layer 570 so as to form contact holes which expose the metal layer 592 over the body contact regions 590 and expose the substrate 502 in the diode-connected MOSFET drain NLDD region 536 and the source NLDD region 538. A diode-connected source/drain contact implant process 614 is performed which implants n-type dopants such as arsenic into the substrate 502 in the diode-connected MOSFET drain NLDD region 536 and the source NLDD region 538 exposed by the contact holes. The contact etch mask 612 is removed after the diode-connected source/drain contact implant process 614 is completed. Subsequently, an anneal operation, such as a spike anneal in an RTP tool, is performed which heats the substrate 502 so as to activate the implanted dopants and form the diode-connected MOSFET drain contact region 540 and source contact region 542 with an exemplary average doping density of $5 \times 10^{19}$ cm$^{-3}$ to $5 \times 10^{20}$ cm$^{-3}$. The anneal may be, for example, an RTP anneal of 1000° C. for 60 seconds.

Figure 6K:
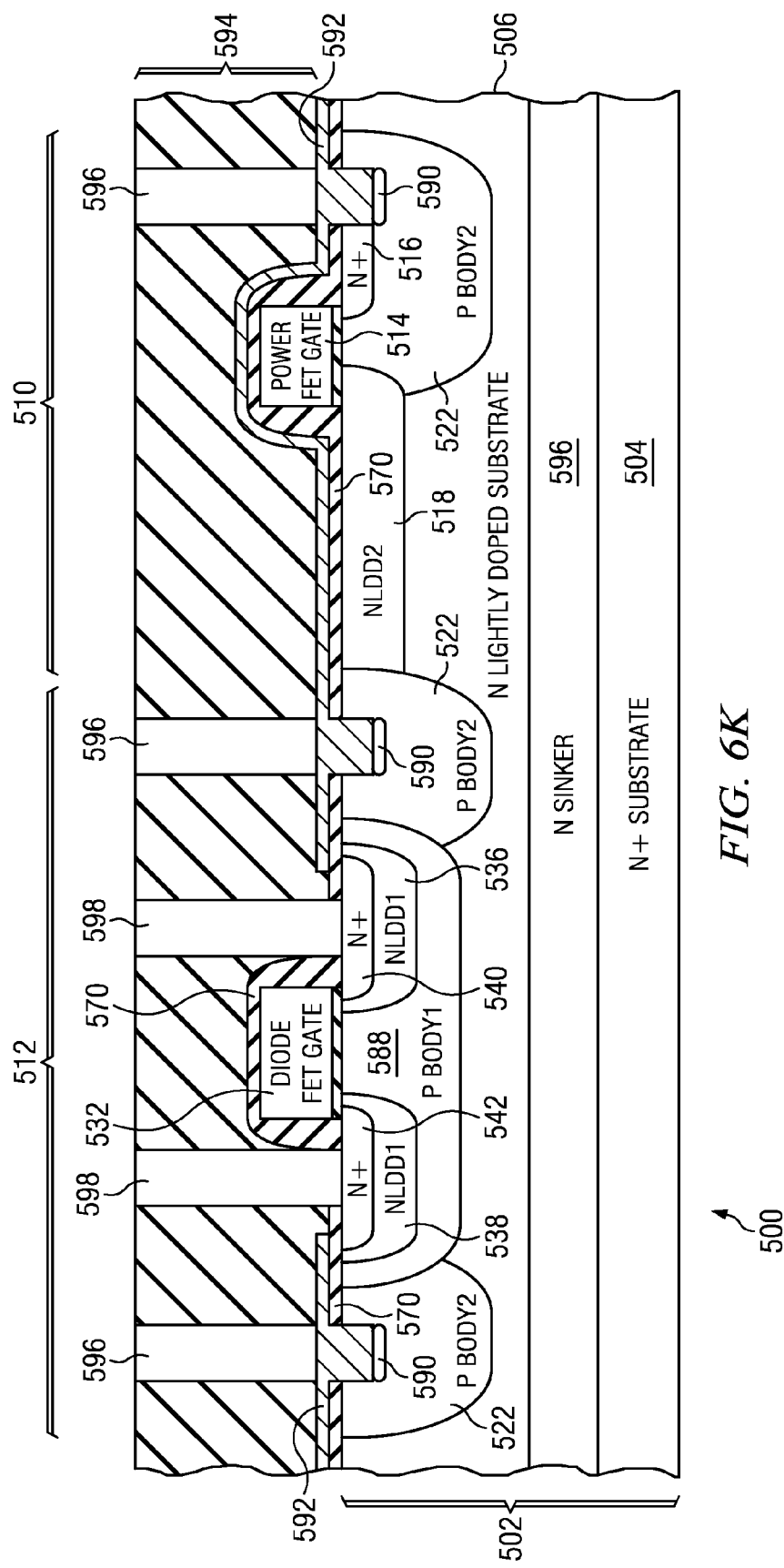

Referring to FIG. 6K, the body contacts 600 and the source/drain contacts 602 are formed in the contact holes. The contacts 600 and 598 may be formed, for example, by filling the contact holes with a contact liner metal, such as titanium liner or a titanium and titanium nitride dual liner, and a contact fill metal, typically tungsten, followed by removal of the contact fill metal from the top surface of the ILD layer 594 using known etching and/or chemical mechanical polish (CMP) methods.

Subsequently, the metal interconnects described in reference to FIG. 5 are formed. A portion of the substrate 502 is removed from the bottom, for example by backgrinding, to thin the semiconductor device 500. The metal drain contact layer 530 of FIG. 5 is formed on the bottom surface of the thinned substrate 502, to form the completed semiconductor device 500 depicted in FIG. 5.

Figure 7:
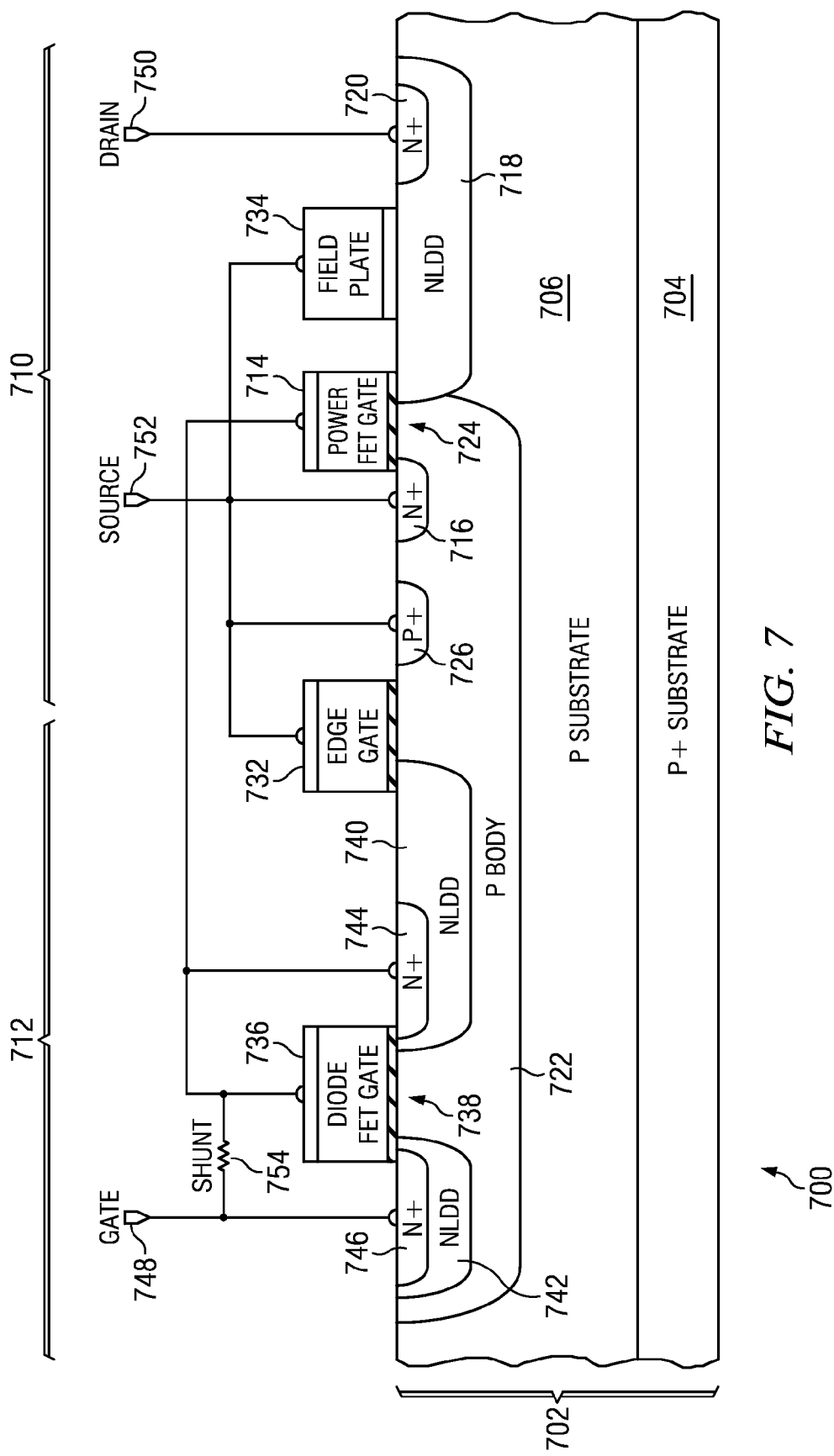
FIG. 7 is a cross section of a semiconductor device containing a lateral re-channel power MOSFET with a gate connected through a parallel shunt resistor and diode-connected MOSFET.

FIG. 7 is a cross section of a semiconductor device containing a lateral re-channel power MOSFET with a gate connected through a parallel shunt resistor and diode-connected MOSFET. It will be recognized that a p-channel version may be realized by appropriate changes of polarity of elements of the semiconductor device. The semiconductor device 700 is formed in and on a p-type semiconductor substrate 702, which may be, for example, a single crystal silicon wafer, possibly having a heavily doped base region 704 and including a lightly doped epitaxial layer 706 at a top surface of the substrate 702, as depicted in FIG. 7. Alternatively, the substrate 702 may be a homogenous p-type single crystal silicon wafer with a substantially uniform doping density. Other substrate configurations suitable for forming the semiconductor device 700 are within the scope of the instant embodiment. The semiconductor device 700 includes an area defined for the power MOSFET 710 and an area defined for the diode-connected MOSFET 712 proximate to the power MOSFET 710. A p-type body region 722 is disposed in the substrate 702 so as to provide a body region for the power MOSFET 710 and the diode-connected MOSFET 712, as depicted in FIG. 7. Alternatively, separate p-type body regions may be disposed in the power MOSFET 710 and the diode-connected MOSFET 712, capable of being separately biased. The body region 722 may include a p-type body contact region 726.

The power MOSFET 710 has a gate structure 714 as described in reference to FIG. 3, disposed on the substrate 702 over a channel region 724 at the top surface of the substrate 702 in the body region 722. The power MOSFET 710 includes an n-type source region 716 in the substrate 702 adjacent to the power MOSFET gate structure 714. The power MOSFET 710 further includes an n-type extended NLDD region 718 in the substrate 702 adjacent to the power MOSFET gate structure 714 opposite from the source region 716. The extended NLDD region 718 contains an n-type drain contact region 720 with a same average doping density as the source region 716. An effective gate length of the power MOSFET 710, corresponding to a lateral distance between the source region 716 and the extended NLDD region 718, may be, for example, 0.3 to 1 micron.

An optional edge gate 732 may be disposed over the substrate 702 so as to overlap a boundary of the body region 722. An optional field plate 734 may be formed over the power MOSFET extended NLDD region 718. the field plate 734 may be formed by extended source contact metal on the power MOSFET source region 716, for example as described in reference to FIG. 3.

The diode-connected MOSFET 712 has a gate structure 736 which has the same layer structure as the power MOSFET gate structure 714. The lightly doped substrate 706 may extend to a channel region 738 under the diode-connected MOSFET gate structure 736 to provide a body region for the diode-connected MOSFET 712. Alternatively, the body region 722 may be extended into the diode-connected MOSFET 712 to provide the diode-connected MOSFET body region, as depicted in FIG. 7. The diode-connected MOSFET 712 includes an n-type source NLDD region 740 and an n-type drain NLDD region 742 in the substrate 702 adjacent to, and on opposite sides of, the diode-connected MOSFET gate structure 736. The source NLDD region 740 and the drain NLDD region 742 have average doping densities substantially equal to the power MOSFET extended NLDD region 718. The source NLDD region 740 contains an n-type source contact region 744 and the drain NLDD region 742 contains an n-type drain contact region 746; both the source contact region 744 and the drain contact region 746 have an average doping density substantially equal to the power MOSFET source region 716 and power MOSFET drain contact region 720. The source NLDD region 740 and the drain NLDD region 742 are electrically isolated from the power MOSFET source region 716 through pn junctions at boundaries between the source NLDD region 740 and the drain NLDD region 742 and the body region 722. An effective gate length of the diode-connected MOSFET 712, corresponding to a lateral distance between the source NLDD region 740 and the drain NLDD region 742, may be, for example, 0.5 to 2 microns. The field plate 732 may overlap the diode-connected MOSFET source NLDD region 740, as depicted in FIG. 7, and possibly the diode-connected MOSFET drain NLDD region 742.

Metal interconnects are disposed over the substrate 702 so as to electrically connect elements of the power MOSFET 710 and the diode-connected MOSFET 712. A gate input node 748 of the semiconductor device 700 is directly connected to the diode-connected MOSFET drain contact region 746. A drain input/output node 750 of the semiconductor device 700 is directly connected to the power MOSFET drain contact region 720. A source input/output node 752 of the semiconductor device 700 is directly connected to the power MOSFET source region 716. The gate input node 748 is connected through a shunt resistor 754 to the diode-connected MOSFET gate structure 736. The diode-connected MOSFET gate structure 736 is directly connected to the diode-connected MOSFET source contact region 744 and the field plate 732. The power MOSFET source region 716 is connected to the body contact region 726 and may be connected to the field plate 732. Alternatively, the field plate 732 may be biased by a separate voltage source.

Figure 8:
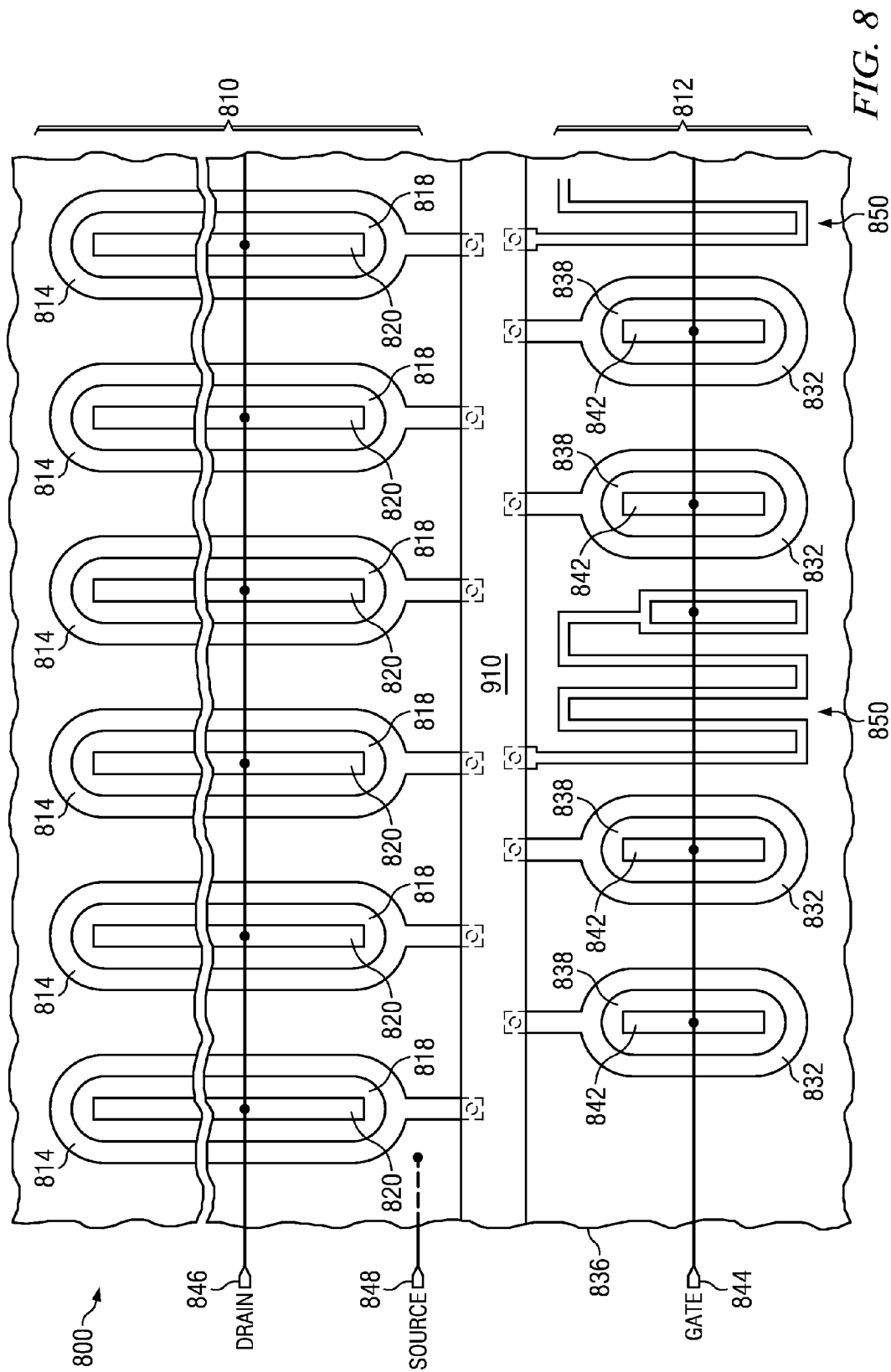
FIG. 8 is a top view of a portion of a semiconductor device containing a power MOSFET with a gate connected through a parallel plurality of shunt resistors and diode-connected MOSFETs.

FIG. 8 is a top view of a portion of a semiconductor device containing a power MOSFET in a source-down configuration with a gate connected through a parallel plurality of shunt resistors and diode-connected MOSFETs. The semiconductor device 800 includes an area defined for the power MOSFET 810 and areas defined for the diode-connected MOSFETs 812 proximate to the power MOSFET 810. The power MOSFET 810 may be configured as a linear array of instances of closed-loop gates 814, central drain NLDD regions 818 and a surrounding source 816, connected in parallel, as depicted in FIG. 8. The diode-connected MOSFET 812 may be configured as a linear array of instances of closed-loop gates 832, central source NLDD regions 838 and a surrounding drain NLDD region 836, connected in parallel. The power MOSFET gates 814, the diode-connected MOSFET gates 832 and shunt resistors 850 may be connected to an anode bus 910 formed of a metal interconnect of the semiconductor device 800. A gate input node 844 is electrically coupled to source contact regions 842 of the diode-connected MOSFET 812 and to the shunt resistors 850. A drain input/output node 846 is electrically coupled to drain contact regions 820 in the power MOSFET central drain NLDD regions 818. A source input/output node 848 is connected to a backside source metal contact of the power MOSFET 810.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
   a semiconductor substrate;
   a power metal oxide semiconductor field effect transistor (MOSFET), including:
      a power MOSFET gate structure disposed on said substrate;
      a body region of a first conductivity type disposed in said substrate under said power MOSFET gate structure;
      a source region of a second conductivity type opposite from said first conductivity type; and
      a drain region of said second conductivity type;
   a diode-connected MOSFET proximate to said power MOSFET, including:
      a gate structure disposed on said substrate;
      a source region of said second conductivity type;
      a drain region of said second conductivity type; and
      a body region of said first conductivity type disposed in said substrate under said diode-connected MOSFET gate structure; and
   metal interconnects, so that:
      a gate input node of said semiconductor device is electrically coupled to said drain region of said diode-connected MOSFET;
      said gate input node is electrically coupled through a shunt resistor to said power MOSFET gate structure and said diode-connected MOSFET drain region;
      a drain input/output node of said semiconductor device is electrically coupled to said power MOSFET drain region; and
      a source input/output node of said semiconductor device is electrically coupled to said power MOSFET source region;
   so that said diode-connected MOSFET source region is electrically isolated from said power MOSFET source region by a pn junction and said diode-connected MOSFET drain region is electrically isolated from said power MOSFET source region by a pn junction.

2. The semiconductor device of claim 1, in which said first conductivity type is p-type, said second conductivity type is n-type, and said power MOSFET and said diode-connected MOSFET are n-channel transistors.

3. The semiconductor device of claim 1, in which:
said substrate has said first conductivity type;
said power MOSFET drain region is disposed at a top surface of said substrate;
said drain input/output node makes electrical connection to said power MOSFET drain region at said substrate top surface;
said power MOSFET source region is disposed at a top surface of said substrate;
said power MOSFET source region is electrically coupled to a power MOSFET source contact region disposed at a bottom surface of said substrate; and
said source input/output node makes electrical connection to said power MOSFET source contact region at said substrate bottom surface.

4. The semiconductor device of claim 1, in which:
said substrate has said second conductivity type;
said power MOSFET source region is disposed at a top surface of said substrate;
said source input/output node makes electrical connection to said power MOSFET source region at said substrate top surface;
said power MOSFET drain region is disposed at a top surface of said substrate;
said power MOSFET drain region is electrically coupled to a power MOSFET drain contact region disposed at a bottom surface of said substrate; and
said drain input/output node makes electrical connection to said power MOSFET drain contact region at said substrate bottom surface.

5. The semiconductor device of claim 1, in which a field plate overlaps said power MOSFET drain region and said diode-connected MOSFET drain region.

6. The semiconductor device of claim 1, further including heavily doped breakdown layers having said first conductivity type disposed at a lower boundary of said diode-connected MOSFET source region and at a lower boundary of said diode-connected MOSFET drain region.

7. The semiconductor device of claim 1, in which:
an effective gate length of said power MOSFET, corresponding to a lateral distance between said power MOSFET source region and said power MOSFET drain region, is 0.3 to 1 micron; and
an effective gate length of said diode-connected MOSFET, corresponding to a lateral distance between said diode-connected MOSFET source region and said diode-connected MOSFET drain region, is 0.5 to 2 microns.

8. The semiconductor device of claim 1, in which said diode connected MOSFET is a first diode connected MOSFET, and further including a second diode connected MOSFET, in which said first diode connected MOSFET and said second diode connected MOSFET are disposed at a periphery of said power MOSFET.

9. A process of forming a semiconductor device, comprising the steps of:
providing a semiconductor substrate;
concurrently forming a gate structure of a power MOSFET over said substrate and a gate structure for a diode-connected MOSFET over said substrate;
forming at least one body region in said substrate in at least an area defined for said power MOSFET, said body region having a first conductivity type;
forming a drain region of said power MOSFET in said substrate, said power MOSFET drain region having a second conductivity type opposite from said first conductivity type;
forming a source region of said power MOSFET in said substrate, said power MOSFET source region having said second conductivity type;
forming a source region of said diode-connected MOSFET in said substrate, said diode-connected MOSFET source region having said second conductivity type;
forming a drain region of said diode-connected MOSFET in said substrate, said diode-connected MOSFET drain region having said second conductivity type;
so that said diode-connected MOSFET source region is electrically isolated from said power MOSFET source region by a pn junction and said diode-connected MOSFET drain region is electrically isolated from said power MOSFET source region by a pn junction; and
forming metal interconnects, so that:
a gate input node of said semiconductor device is electrically coupled to said diode-connected MOSFET source region;
said gate input node is electrically coupled through a shunt resistor to said power MOSFET gate structure and said diode-connected MOSFET drain region;
a drain input/output node of said semiconductor device is electrically coupled to said power MOSFET drain region; and
a source input/output node of said semiconductor device is electrically coupled to said power MOSFET source region.

10. The process of claim 9, in which said first conductivity type is p-type, said second conductivity type is n-type, and said power MOSFET and said diode-connected MOSFET are n-channel transistors.

11. The process of claim 9, in which:
said substrate has said first conductivity type;
said process includes forming a power MOSFET source contact region having said first conductivity type disposed at a bottom surface of said substrate;
said process includes forming a sinker having said first conductivity type so that said sinker provides an electrical connection between said power MOSFET source region and said power MOSFET source contact region;
said drain input/output node makes electrical connection to said power MOSFET drain region at said substrate top surface; and
said source input/output node makes electrical connection to said power MOSFET source contact region at said substrate bottom surface.

12. The process of claim 9, in which:
said substrate has said second conductivity type;
said power MOSFET drain region is disposed at a top surface of said substrate;
said process includes forming a power MOSFET drain contact region having said second conductivity type disposed at a bottom surface of said substrate, so that said power MOSFET drain region is electrically coupled to said power MOSFET drain contact region through said substrate;
said power MOSFET source region is disposed at a top surface of said substrate;

said source input/output node makes electrical connection to said power MOSFET source region at said substrate top surface; and said drain input/output node makes electrical connection to said power MOSFET drain contact region at said substrate bottom surface.

13. The process of claim 9, in which a field plate overlaps said power MOSFET drain region and said diode-connected MOSFET drain region.

14. The process of claim 9, further including forming heavily doped breakdown layers having said first conductivity type disposed at a lower boundary of said diode-connected MOSFET source region and at a lower boundary of said diode-connected MOSFET drain region.

15. The process of claim 9, in which:
- an effective gate length of said power MOSFET, corresponding to a lateral distance between said power MOSFET source region and said power MOSFET drain region, is 0.3 to 1 micron; and
- an effective gate length of said diode-connected MOSFET, corresponding to a lateral distance between said diode-connected MOSFET source region and said diode-connected MOSFET drain region, is 0.5 to 2 microns.

16. The process of claim 9, in which said diode-connected MOSFET is a first diode-connected MOSFET, and further including the steps of:

forming a source region of a second diode-connected MOSFET and a drain region of said second diode-connected MOSFET in said substrate concurrently with said first diode-connected MOSFET source region and drain region, said second diode-connected MOSFET source region and drain region having said second conductivity type, said second diode-connected MOSFET being located proximate to said power MOSFET, so that said second diode-connected MOSFET source region is electrically isolated from said power MOSFET source region by a pn junction and said second diode-connected MOSFET drain region is electrically isolated from said power MOSFET source region by a pn junction;

forming a gate structure of said second diode-connected MOSFET over said substrate concurrently with said first diode-connected MOSFET gate structure; and forming said metal interconnects so that:
- said gate input node of said semiconductor device is electrically coupled to said second diode-connected MOSFET drain region; and
- said gate input node is electrically coupled through a second shunt resistor to said power MOSFET gate structure and said second diode-connected MOSFET drain region.

* * * * *